United States Patent
Lu et al.

(10) Patent No.: US 12,101,939 B2
(45) Date of Patent: Sep. 24, 2024

(54) THREE-DIMENSIONAL MEMORY DEVICE WITH FERROELECTRIC MATERIAL

(71) Applicant: Taiwan Semiconductor Manufacturing Co., Ltd., Hsinchu (TW)

(72) Inventors: Chun-Chieh Lu, Taipei (TW); Sai-Hooi Yeong, Zhubei (TW); Bo-Feng Young, Taipei (TW); Yu-Ming Lin, Hsinchu (TW); Chi On Chui, Hsinchu (TW); Han-Jong Chia, Hsinchu (TW); Chenchen Jacob Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 225 days.

(21) Appl. No.: 17/883,834

(22) Filed: Aug. 9, 2022

(65) Prior Publication Data

US 2022/0384483 A1    Dec. 1, 2022

Related U.S. Application Data

(62) Division of application No. 17/070,536, filed on Oct. 14, 2020, now Pat. No. 11,631,698.

(Continued)

(51) Int. Cl.
*H10B 51/20*   (2023.01)
*H10B 51/10*   (2023.01)
*H10B 51/30*   (2023.01)

(52) U.S. Cl.
CPC .............. *H10B 51/20* (2023.02); *H10B 51/10* (2023.02); *H10B 51/30* (2023.02)

(58) Field of Classification Search
CPC ........ H10B 43/20; H10B 51/00; H10B 51/10; H10B 51/20; H10B 51/30; H10B 51/40
See application file for complete search history.

(56) References Cited

U.S. PATENT DOCUMENTS 8,630,114 B2   1/2014 Lue
9,379,129 B1 * 6/2016 Lue ................... H10B 43/20
(Continued)

FOREIGN PATENT DOCUMENTS

CN    108401468 A    8/2018
JP    2008192804 A * 8/2008 ......... G11C 16/0475
(Continued)

*Primary Examiner* — Matthew E Warren
(74) *Attorney, Agent, or Firm* — Slater Matsil, LLP

(57) ABSTRACT

A method of forming a memory device includes: forming a first layer stack and a second layer stack successively over a substrate, the first layer stack and the second layer stack having a same layered structure that includes a dielectric material, a channel material over the dielectric material, and a source/drain material over the channel material; forming openings that extend through the first layer stack and the second layer stack; forming inner spacers by replacing portions of the source/drain material exposed by the openings with a first dielectric material; lining sidewalls of the openings with a ferroelectric material; forming gate electrodes by filling the openings with an electrically conductive material; forming a recess through the first layer stack and the second layer stack, the recess extending from a sidewall of the second layer stack toward the gate electrodes; and filling the recess with a second dielectric material.

20 Claims, 20 Drawing Sheets

Related U.S. Application Data

(60) Provisional application No. 63/031,103, filed on May 28, 2020.

(56) References Cited

U.S. PATENT DOCUMENTS

| | | | |
|---|---|---|---|
| 9,437,483 B2 | 9/2016 | Lee et al. | |
| 10,515,981 B2 * | 12/2019 | Or-Bach | B82Y 10/00 |
| 11,411,025 B2 * | 8/2022 | Lai | H01L 29/516 |
| 2017/0133395 A1 | 5/2017 | Or-Bach et al. | |
| 2018/0269229 A1 | 9/2018 | Or-Bach et al. | |
| 2018/0350823 A1 * | 12/2018 | Or-Bach | G11C 16/10 |
| 2019/0148286 A1 | 5/2019 | Or-Bach et al. | |
| 2020/0098779 A1 * | 3/2020 | Cernea | H01L 23/5283 |
| 2020/0168630 A1 | 5/2020 | Borukhov | |
| 2021/0242241 A1 * | 8/2021 | Rajashekhar | H01L 29/42344 |

FOREIGN PATENT DOCUMENTS

| | | |
|---|---|---|
| KR | 20120053331 A | 5/2012 |
| KR | 20180059271 A | 6/2018 |
| TW | 201232538 A | 8/2012 |

* cited by examiner

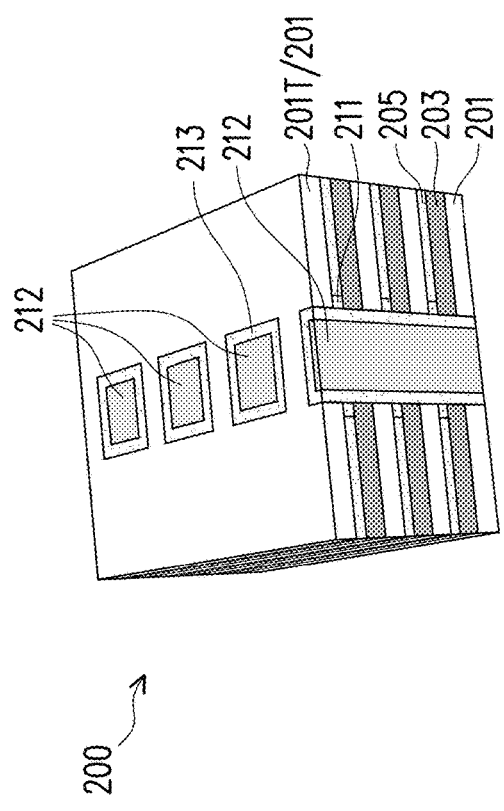
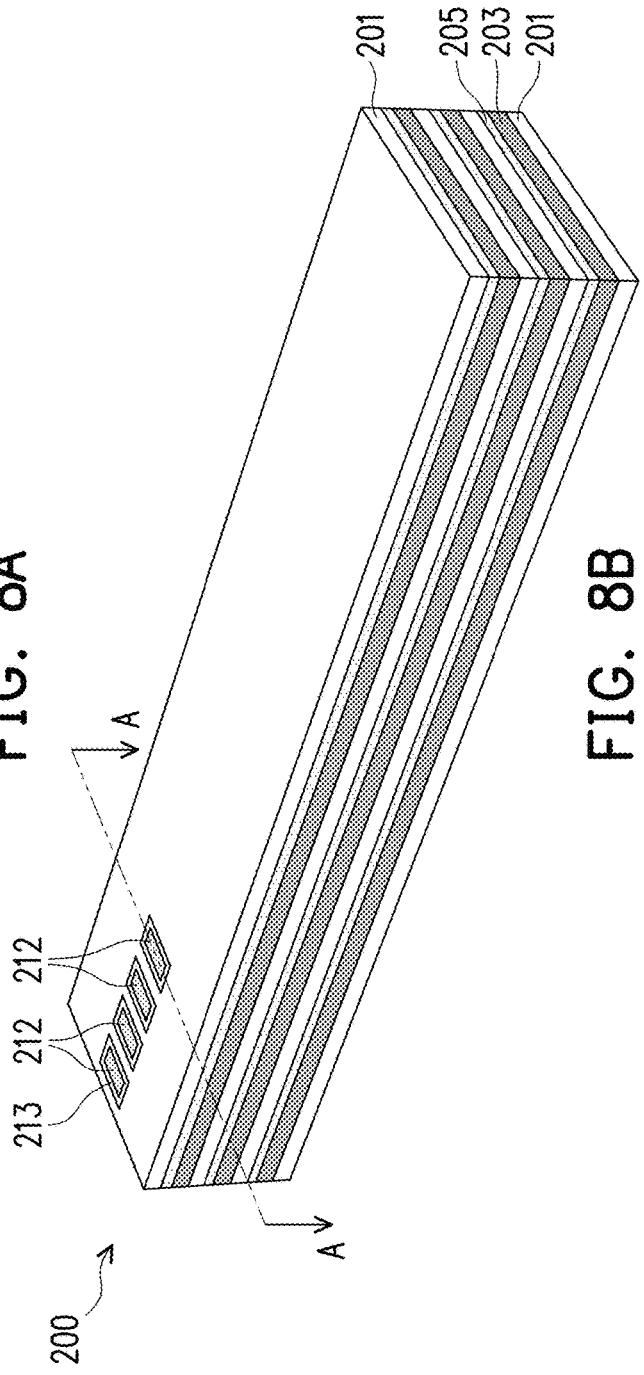
FIG. 8A
FIG. 8B

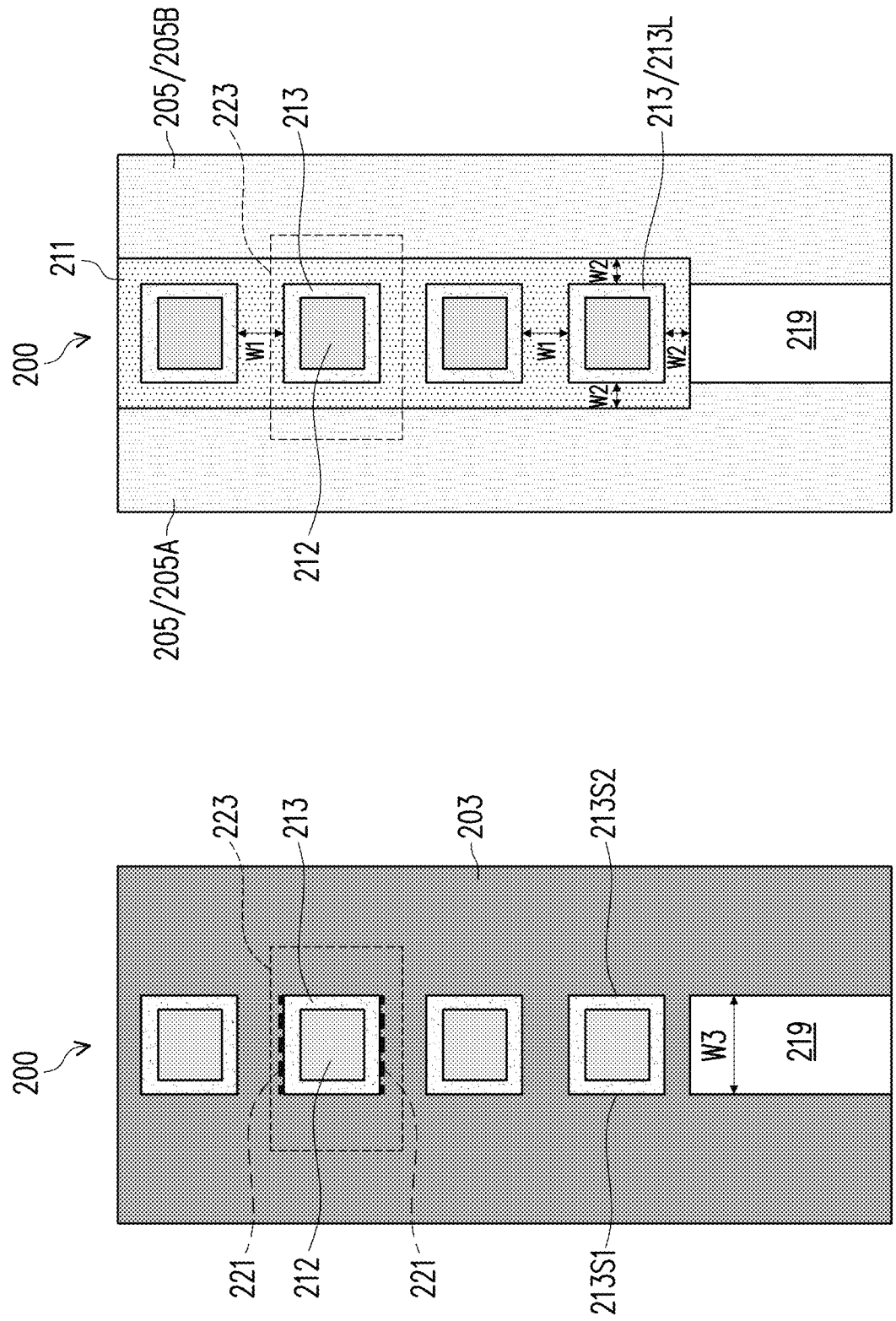

US 12,101,939 B2

THREE-DIMENSIONAL MEMORY DEVICE WITH FERROELECTRIC MATERIAL

PRIORITY CLAIM AND CROSS-REFERENCE

This application is a divisional of U.S. patent application Ser. No. 17/070,536, filed Oct. 14, 2020, entitled "Three-Dimensional Memory Device with Ferroelectric Material," which claims the benefit of U.S. Provisional Application No. 63/031,103, filed on May 28, 2020, which applications are hereby incorporated herein by reference.

TECHNICAL FIELD

The present invention relates generally to semiconductor memory devices, and, in particular embodiments, to three-dimensional memory devices formed with ferroelectric material.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2-7, 8A, 8B, 9, 10A, 10B, 10C, 10F, 10G, 10H, 10I, 10J, 11, and 12 illustrate various views of a three-dimensional memory device at various stages of manufacturing, in an embodiment;

DETAILED DESCRIPTION OF ILLUSTRATIVE EMBODIMENTS

Figure 1:
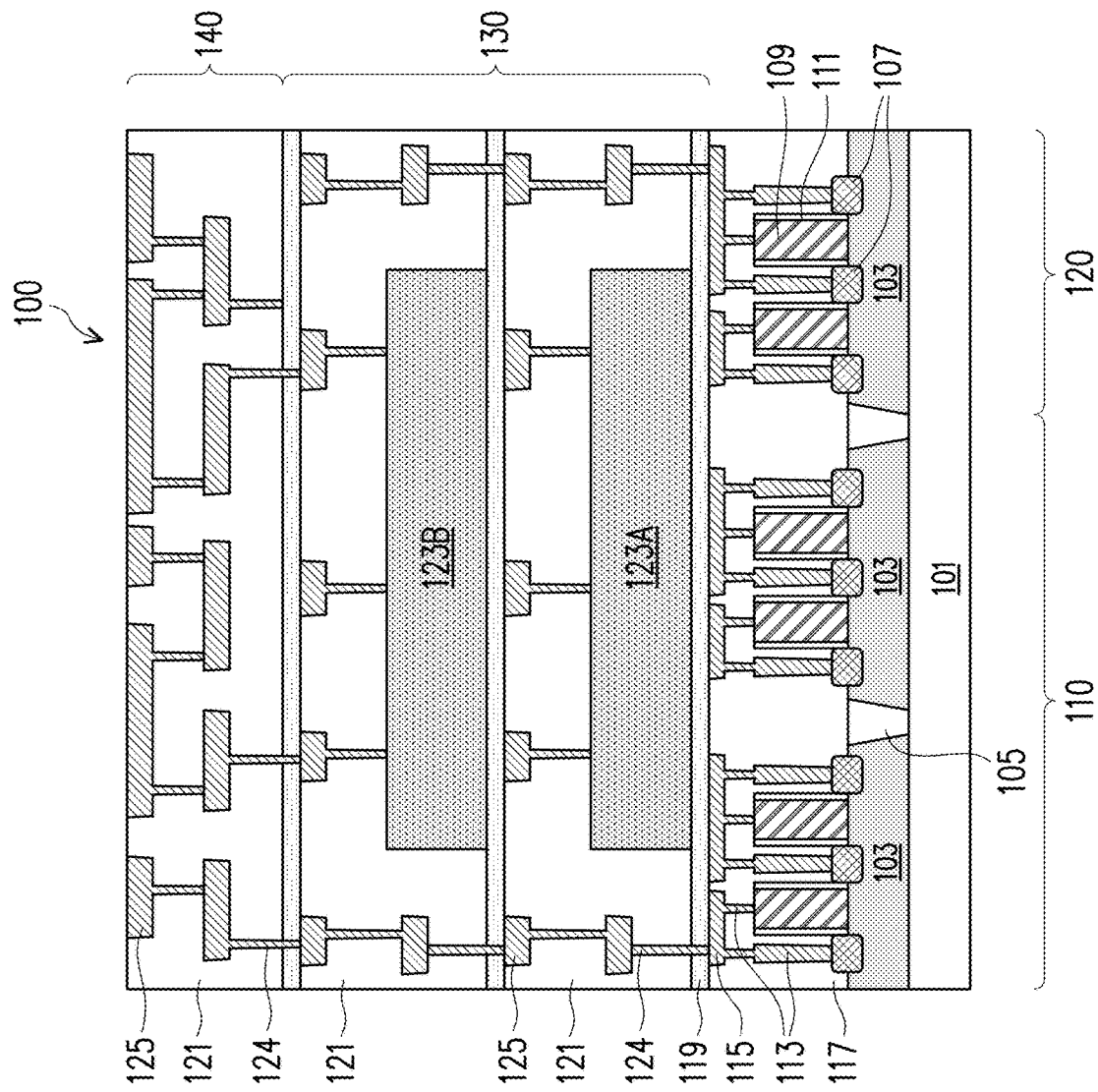
FIG. 1 illustrates a cross-sectional view of a semiconductor device with integrated memory devices, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar process using a same or similar material(s).

In some embodiments, a method of forming a memory device includes: forming a first layer stack and a second layer stack successively over a substrate, the first layer stack and the second layer stack having a same layered structure that includes a dielectric material, a channel material over the dielectric material, and a source/drain material over the channel material; forming openings that extend through the first layer stack and the second layer stack; forming inner spacers by replacing portions of the source/drain material exposed by the openings with a first dielectric material; lining sidewalls of the openings with a ferroelectric material; forming gate electrodes by filling the openings with an electrically conductive material; forming a recess through the first layer stack and the second layer stack, the recess extending from a sidewall of the second layer stack toward the gate electrodes; and filling the recess with a second dielectric material.

FIG. 1 illustrates a cross-sectional view of a semiconductor device 100 with integrated memory devices 123 (e.g., 123A and 123B), in an embodiment. The semiconductor device 100 is a fin-field effect transistor (FinFET) device with three-dimensional (3D) memory devices 123 integrated in the back-end-of-line (BEOL) processing of semiconductor manufacturing, in the illustrated embodiment. To avoid clutter, details of the 3D memory devices 123 are not shown in FIG. 1, but are discussed hereinafter.

As illustrated in FIG. 1, the semiconductor device 100 includes different regions for forming different types of circuits. For example, the semiconductor device 100 may include a first region 110 for forming logic circuits, and may include a second region 120 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure.

The semiconductor device 100 includes a substrate 101. The substrate 101 may be a bulk substrate, such as a silicon substrate, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the substrate 101 in the front-end-of-line (FEOL) processing of semiconductor manufacturing. In the example of FIG. 1, semiconductor fins 103 (also referred to as fins) are formed protruding above the substrate 101. Isolation regions 105, such as shallow-trench isolation (STI) regions, are formed between or around the semiconductor fins 103. Gate electrodes 109 are formed over the semiconductor fins 103. Gate spacers 111 are formed along sidewalls of the gate electrodes 109. Source/drain regions 107, such as epitaxial source/drain regions, are formed on opposing sides of the gate electrodes 109. Contacts 113, such as gate contacts and source/drain contacts, are formed over and electrically coupled to respective underlying electrically conductive features (e.g., gate electrodes 109 or source/drain regions 107). One or more dielectric layers 117, such as an inter-layer dielectric (ILD) layer, is formed over the substrate 101 and around the semiconductor fins 103 and the gate electrodes 109. Other electrically conductive features, such as conductive lines 115, may also be formed in the one or more dielectric layers 117. The FinFETs in FIG. 1 may be formed by any suitable method known or used in the art, details are not repeated here.

Still referring to FIG. 1, a dielectric layer 119, which may be an etch stop layer (ESL), is formed over the one or more dielectric layers 117. In an embodiment, the dielectric layer 119 is formed of silicon nitride using plasma-enhanced physical vapor deposition (PECVD), although other dielectric materials such as nitride, carbide, combinations thereof, or the like, and alternative techniques of forming the dielectric layer 119, such as low-pressure chemical vapor deposition (LPCVD), PVD, or the like, could alternatively be used. Next, a dielectric layer 121 is formed over the dielectric layer 119. The dielectric layer 121 may be any suitable dielectric material, such as silicon oxide, silicon nitride, or the like, formed by a suitable method, such as PVD, CVD, or the like. One or more memory device 123A, each of which includes a plurality of memory cells, are formed in the dielectric layer 121 and coupled to electrically conductive features (e.g., vias 124 and conductive lines 125) in the dielectric layer 121. Various embodiments of the memory devices 123 in FIG. 1, such as memory devices 200, 200A, 200B, and 200C, are discussed hereinafter in details.

FIG. 1 further illustrates a second layer of memory devices 123B formed over the memory devices 123A. The memory devices 123A and 123B may have a same or similar structure, and may be collectively referred to as memory devices 123, or 3D memory devices 123. The example of FIG. 1 illustrates two layers of memory devices 123 as a non-limiting example. Other numbers of layers of memory devices 123, such as one layer, three layers, or more, are also possible and are fully intended to be included within the scope of the present disclosure. The one or more layers of memory device 123 are collective referred to as a memory region 130 of the semiconductor device 100, and may be formed in the back-end-of-line (BEOL) processing of semiconductor manufacturing.

Still referring to FIG. 1, after the memory region 130 is formed, an interconnect structure 140, which includes dielectric layer 121 and electrically conductive features (e.g., vias 124 and conductive lines 125) in the dielectric layer 121, is formed over the memory region 130. The interconnect structure 140 electrically connects the elements formed in/on the substrate 101 and the memory devices 123 to form functional circuits. Formation of interconnect structure is known in the art, thus details are not repeated here.

FIGS. 2-7, 8A, 8B, 9, 10A, 10B, 10C, 10F, 10G, 10H, 10I, 10J, 11, and 12 illustrate various views (e.g., perspective view, cross-sectional view) of a three-dimensional (3D) memory device 200 at various stages of manufacturing, in an embodiment. The 3D memory device 200 is a three-dimensional memory device with a ferroelectric material, and may be, e.g., a 3D NOR-type memory device. The 3D memory device 200 may be used as the memory device 123A and 123B in FIG. 1. Note that for simplicity, not all features of the 3D memory device 200 are illustrated in the figures. In addition, in order to illustrate details of the memory device 200 that may otherwise be obstructed from view, only portions of the memory device 200 are illustrated in some of the Figures. For examples, FIGS. 2-7 and 8A illustrate perspective views of portions of (e.g. portions to the left of cross-section A-A in FIG. 8B) of the memory device 200.

Figure 2:
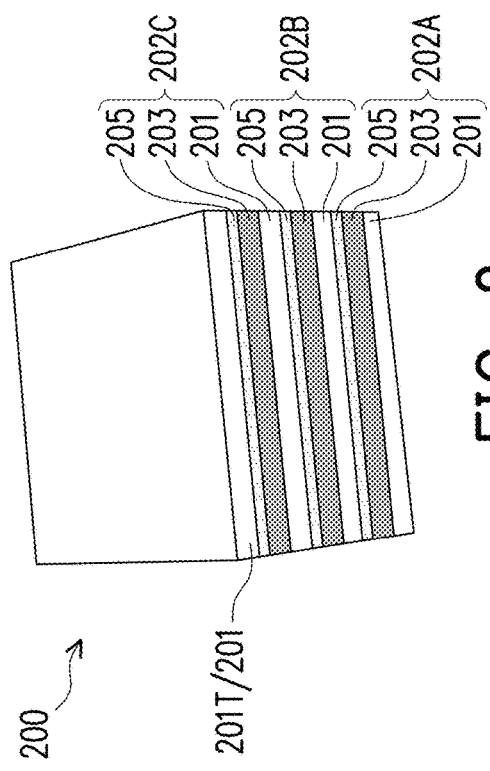

Referring now to FIG. 2, which shows a perspective view of the memory device 200 at an early stage of fabrication. As illustrated in FIG. 2, layer stacks 202A, 202B, and 202C are formed successively over the substrate 101 (not illustrated in FIG. 2 but illustrated in FIG. 1). The layer stacks 202A, 202B, and 202C may be collectively referred to as layer stacks 202 herein. The layer stacks 202A, 202B, and 202C have a same layered structure, in the illustrated embodiments. For example, each of the layer stacks 202 includes a dielectric layer 201, a channel layer 203 over the dielectric layer 201, and a source/drain layer 205 over the channel layer 203.

In some embodiments, to form the layer stack 202A, the dielectric layer 201 is first formed by depositing a suitable dielectric material, such as silicon oxide, silicon nitride, or the like, using a suitable deposition method, such as PVD, CVD, atomic layer deposition (ALD), or the like. Next, the channel layer 203 is formed over the dielectric layer 201. In some embodiments, the channel layer 203 is formed of a semiconductor material, such as amorphous-silicon (a-Si), or polysilicon (poly-Si). In some embodiments, the channel layer 203 is formed of an oxide semiconductor material (may also be referred to as a semiconductive oxide), such as indium gallium zinc oxide (IGZO), zinc oxide (ZnO), indium tungsten oxide (IWO), or the like. The channel layer 203 may be formed by, e.g., PVD, CVD, ALD, combinations thereof, or the like. Next, the source/drain layer 205 is formed over the channel layer 203. In some embodiments, the source/drain layer 205 is formed of a metal material (e.g., an N-type metal or a P-type metal), and therefore, the source/drain layer 205 may also be referred to as a source/drain metal layer 205.

Depending on the type (e.g., N-type or P-type) of device formed, the source/drain metal layer 205 may be formed of an N-type metal or a P-type metal. In some embodiments, Sc, Ti, Cr, Ni, Al, or the like, is used as the N-type metal for forming the source/drain metal layer 205. In some embodiments, Nb, Pd, Pt, Au, or the like, is used as the P-type metal for forming the source/drain metal layer 205. The N-type or P-type metal layer may be formed of a suitable formation method such as PVD, CVD, ALD, sputtering, plating, or the like. In some embodiments, the source/drain metal layer 205 is formed of a metal or a metal-containing material such as Al, Ti, TiN, W, Mo, or indium tin oxide (ITO).

After the layer stack 202A is formed, the process to form the layer stack 202A may be repeated to form the layer stacks 202B and 202C successively over the layer stack 202A, as illustrated in FIG. 1. After the layer stacks 202A, 202B, and 202C are formed, a dielectric layer 201T is formed over the layer stack 202C. In the illustrated embodiment, the dielectric layer 201T is formed of a same dielectric material as the dielectric layer 201 in the layer stacks 202, thus may also be referred to as a dielectric layer 201 in subsequent discussion.

Figure 3:
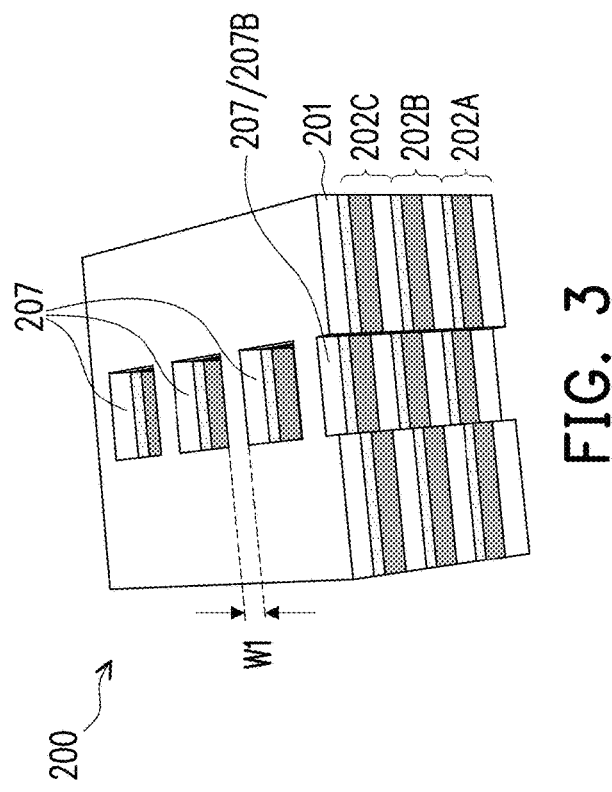

Next, in FIG. 3, an array of openings 207 are formed that extend through the layer stacks 202A, 202B, 202C and the dielectric layer 201 over the layer stack 202C. The array of openings 207 in FIG. 3 is arranged in a column as a non-limiting example. In other embodiments, the array of openings 207 may include multiple rows and/or multiple columns of openings. The array of openings 207 are referred to as openings 207 for easy of discussion hereinafter.

The openings 207 may be formed using photolithography and etching techniques. The openings 207 are formed within boundaries (e.g., perimeters, or sidewalls) of the layer stacks 202, such that each of the openings 207 is surrounded (e.g., encircled) by the layer stacks 202. Note that the opening 207B in FIG. 3, although shown as partially surrounded by the layer stacks 202, is actually completely surrounded by the layer stacks 202 as the other openings 207. This is because FIG. 3 shows only portions of the 3D memory device 200 to the left of the cross-section A-A in FIG. 8B, which cuts through the location of the openings 207B in order to show details of subsequent processing that may otherwise be obstructed from view. In the example of FIG. 3, the openings 207 are aligned in a column, and adjacent openings 207 are separated by a distance W1. In some embodiments, the distance W1 is between about 10 nm and about 50 nm.

Figure 4:
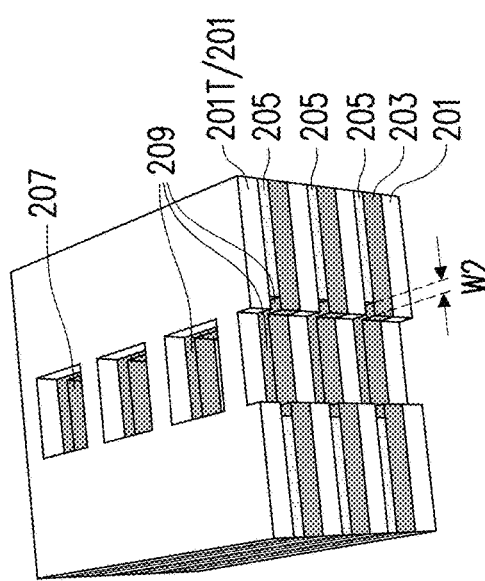

Next, in FIG. 4, portions of the source/drain layers 205 exposed by (e.g., facing) the openings 207 are removed to form recesses 209. For example, an isotropic etching process using an etchant selective to (e.g., having a higher etching rate for) the material of the source/drain layers 205 may be used to remove portions of the source/drain layers 205 facing the openings 207, such that the source/drain layers 205 are laterally recessed from the sidewalls of the openings 207. The etchant used may be, e.g., SC1 solution. A width W2 of the recess 209, measured between the locations of the sidewall of the source/drain layer 205 before and after the recessing of the source/drain layers 205, is between about 1 nm and about 5 nm, as an example.

In the illustrated embodiment, the width W2 is larger than or equal to half of W1 (e.g., W2≥0.5×W1). Since the source/drain layers 205 are laterally recessed from the sidewalls of the openings 207 in all directions, and since W2 is larger than or equal to half of W1, the portions of the source/drain layers 205 between adjacent openings 207 are completely removed. As a result, the subsequently formed inner spacer layer 211 (see, e.g., FIG. 10I) completely fills the spaces between adjacent openings 207 (or equivalently, the space between the subsequently formed ferroelectric material 213 along sidewalls of the openings 207).

Note that in the discussion herein, a sidewall of the layer stack 202A, 202B, or 202C includes the corresponding sidewalls of all the constituent layers (e.g., 201, 203, and 205) of that layer stack. For example, a sidewall of the layer stack 202A exposed by the opening 207 includes the corresponding sidewall of the dielectric layer 201, the corresponding sidewall of the channel layer 203, and the corresponding sidewall of the source/drain layer 205 that are exposed by the opening 207. In the illustrated embodiment, before the recessing of the source/drain layer 205, the corresponding sidewalls of the constituent layers (e.g., 201, 203, and 205) of the layer stacks 202 are aligned along a same vertical plane. After recessing of the source/drain layers 205 to form the recesses 209, the corresponding sidewalls of the dielectric layers 201 and the channel layers 203 of the layer stacks 202 are aligned along a same vertical plane, in the illustrated embodiment.

Figure 5:
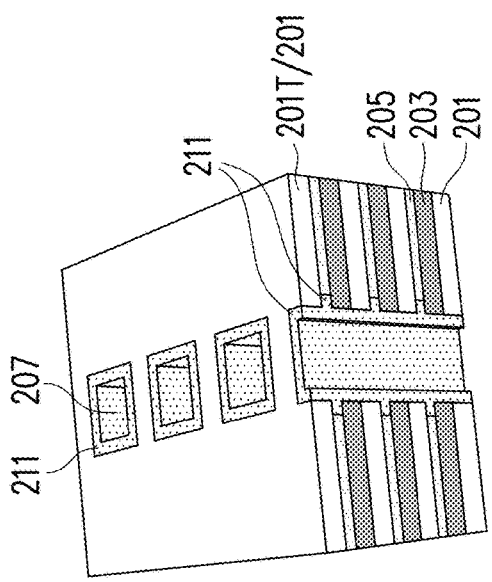

Next, in FIG. 5, an inner spacer layer 211 is formed (e.g., conformally formed) in the openings 207 to line sidewalls and bottoms of the openings 207. The inner spacer layer 211 may also be formed over the upper surface of the topmost dielectric layer 201 in FIG. 5. The inner spacer layer 211 is formed of a suitable dielectric material, such as silicon nitride (SiN), silicon carbon nitride (SiCN), silicon carbon oxynitride (SiCON), or the like, using a suitable method such as CVD, PVD, ALD, or the like. A thickness of the inner spacer layer 211 may be between about 1 nm and about 5 nm, as an example. The inner spacer layer 211 fills the recesses 209, as illustrated in FIG. 5.

Figure 6:
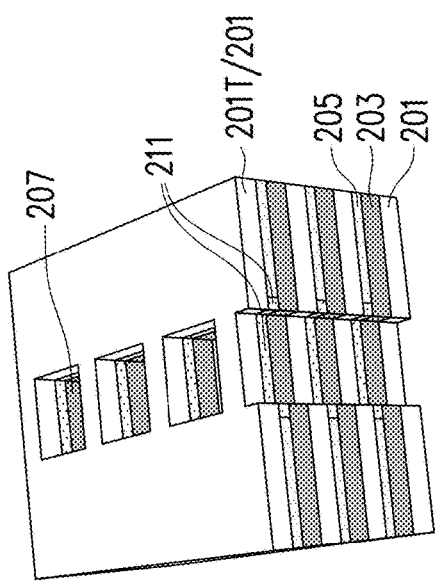

Next, in FIG. 6, portions of the inner spacer layer 211 along the sidewalls of the openings 207 and the bottoms of the openings 207 are removed, e.g., by an anisotropic etching process such as a plasma etching process. After the anisotropic etching process, the inner spacer layer 211 in the recesses 209 remain, and may also be referred to as inner spacers 211. In the example of FIG. 6, sidewalls of the inner spacers 211 facing the openings 207 are aligned with respective sidewalls of the dielectric layers 201 and respective sidewalls of the channel layers 203. The inner spacers 211 may advantageously lower the parasitic capacitance of the device formed, in some embodiments.

Figure 7:
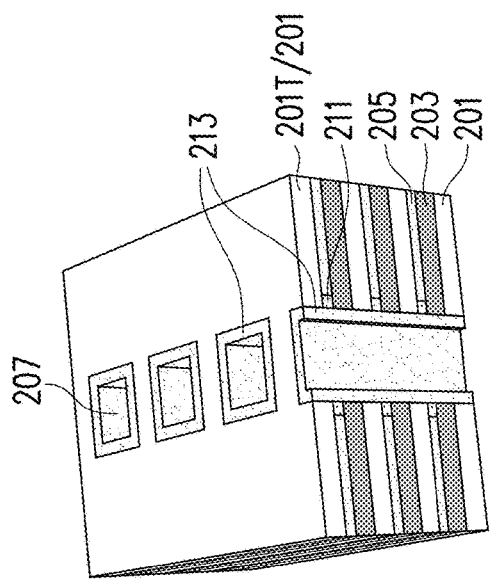

Next, in FIG. 7, a ferroelectric material 213 is formed (e.g., conformally formed) in the openings 207 to line the sidewalls and the bottoms of the openings 207. The ferroelectric material 213 may also be formed over the upper surface of the topmost dielectric layer 201 in FIG. 7. The ferroelectric material 213 is hafnium oxide ($HfO_2$) doped by Al, Si, Zr, La, Gd, or Y, in an embodiment. In some embodiments, a ferroelectric material, such as HZO, HSO, HfSiO, HfLaO, HfZrO2, or ZrO2, is used as the ferroelectric material 213. A suitable formation method, such as PVD, CVD, ALD, or the like, may be used to form the ferroelectric material 213. Next, an etching process, such as an anisotropic etching process, may be performed to remove the ferroelectric material 213 from the upper surface of the topmost dielectric layer 201 (if formed) and from the bottoms of the openings 207. After the etching process, the ferroelectric material 213 lines sidewalls of the openings 207.

Next, in FIG. 8, an electrical conductive material (also referred to as a gate material, or a gate metal), such as Al, W, Mo, TiN, TaN, combinations thereof, or multilayers thereof, is formed to fill the openings 207. The gate material may be formed by a suitable method, such as PVD, CVD, ALD, plating, or the like. After the gate material is formed, a planarization process, such as a chemical mechanical planarization (CMP), may be performed to remove excess portions of the gate material from the upper surface of the topmost dielectric layer 201, and the remaining portions of the gate material in the openings 207 form gate electrodes 212. As illustrated in FIG. 8, the ferroelectric material 213 surrounds each of gate electrodes 212. For example, the ferroelectric material 213 physically contacts and extends along sidewalls of the gate electrodes 212. The inner spacers 211 are embedded in the source/drain layers 205 and physically contact the ferroelectric material 213.

FIG. 8B shows a more complete perspective view of the memory device 200, which shows all gate electrodes 212 completely surrounded by the layer stacks 202. The perspective view of FIG. 8A corresponds to that of a portion of the device in FIG. 8B (e.g., the portion to the left of cross-section A-A).

Figure 9:
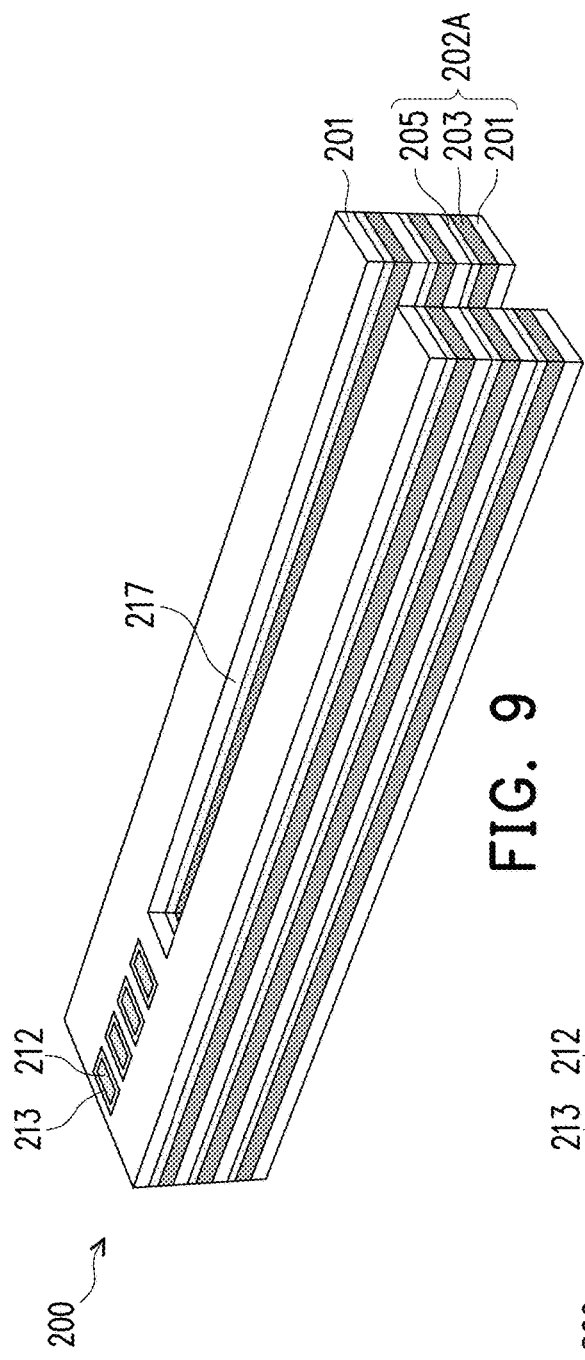

Next, in FIG. 9, a recess 217 (may also be referred to as an opening or a trench) is formed that extends through the topmost dielectric layer 201 and the layer stacks 202A, 202B, and 202C. The recess 217 may be formed using photolithography and etching techniques. The recess 217 extends from a sidewall of the layer stacks 202 toward the gate electrodes 212. In the example of FIG. 9, the recess 217 is aligned with the gate electrodes 212 in a same column. The recess 217 has a width W3 (see FIG. 10H) between opposing sidewalls of the recess 217. The width W3 may be between about 50 nm and about 150 nm, as an example. In some embodiments, the opposing sidewalls of the recess 217 are aligned with respective outer sidewalls 213S1/213S2 of the ferroelectric material 213 (see, e.g., FIG. 10H).

Figure 10A:
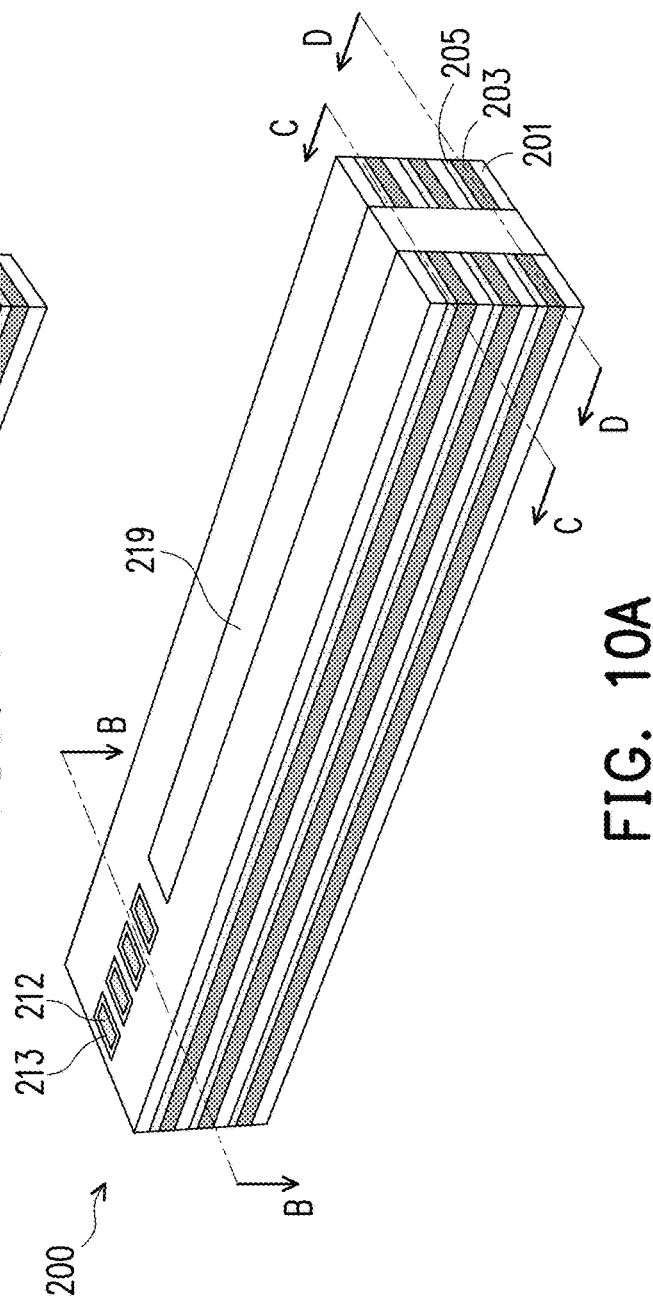

Next, in FIG. 10A, a dielectric material 219 is formed to fill the recess 217. The dielectric material 219 may be, e.g., silicon oxide, silicon nitride, or the like, formed by a suitable method such as CVD, PVD, ALD, or the like. A planarization process, such as CMP, may be performed to remove excess portions of the dielectric material 219 from the upper surface of the topmost dielectric layer 201. The dielectric material 219 thus form an isolation region 219.

Figure 10B:
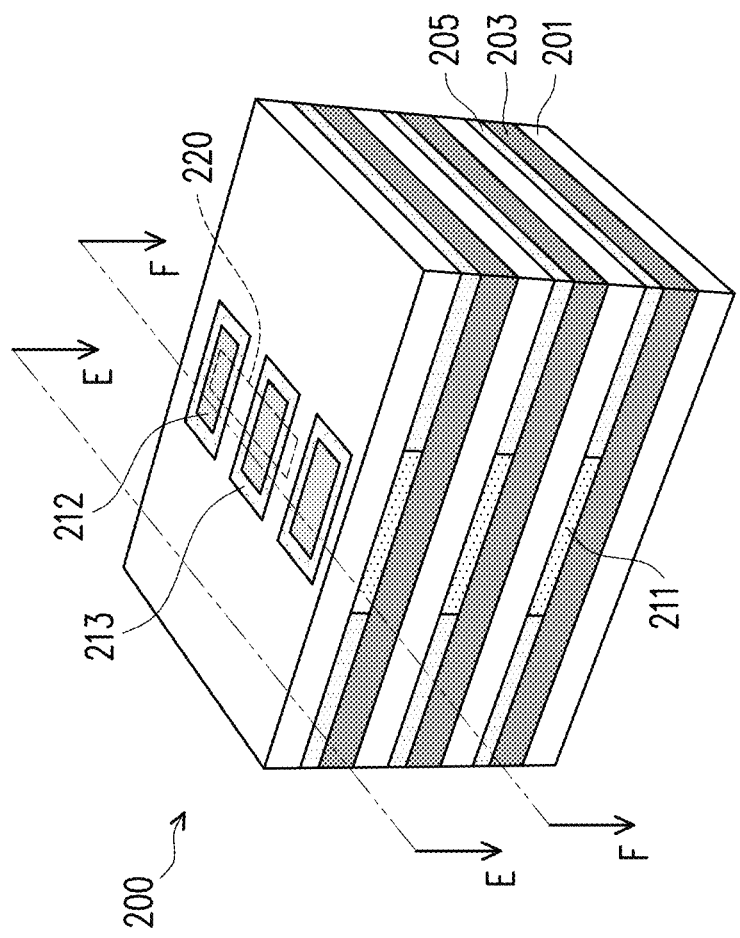

FIG. 10B illustrates a perspective view of a portion of the memory device 200 of FIG. 10A. In particular, FIG. 10B illustrates a portion of the memory device 200 in FIG. 10A, e.g., a portion to the left of cross-section B-B.

Figure 10C:
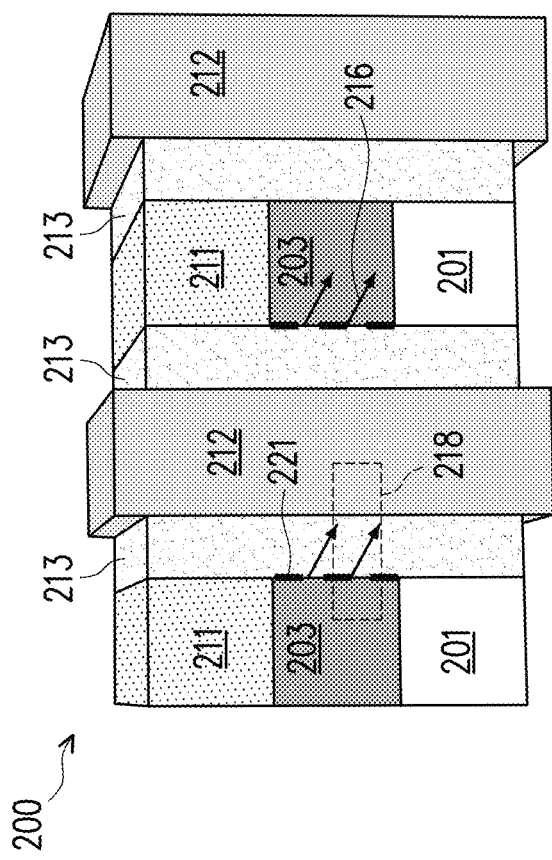

FIG. 10C illustrates a cut-out portion of the memory device 200 within the dashed box 220 in FIG. 10B. For simplicity, only portions of the memory device 200 located at the same vertical levels (e.g., distance from the substrate 101) as the layer stacks 202C are illustrated in FIG. 10C.

As illustrated in FIG. 10C, the ferroelectric material 213 extends along sidewalls of the gate electrodes 212, and is disposed between the gate electrode 212 and a respective channel layer 203. The dashed lines 221 in FIG. 10C illustrate the channel regions formed in the channel layer 203 during operation of the 3D memory device 200, e.g., when a gate voltage is applied at the gate electrode 212. The arrows 216 in FIG. 10C illustrate example electrical current flow directions between source/drain regions (see 205A/205B in FIG. 10I), which are outside of (e.g., in front of and behind) the cut-out portion of FIG. 10C.

Figure 10D:
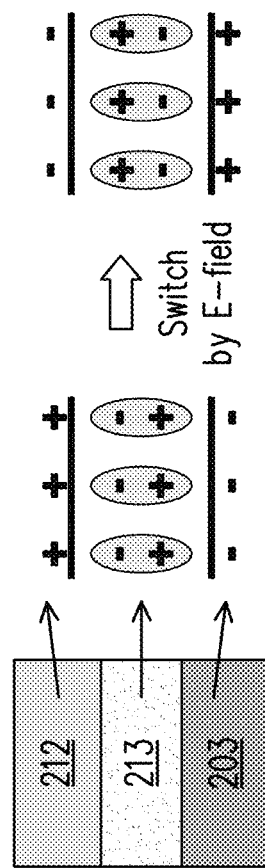
FIG. 10D illustrates switching of the electrical polarization direction of the ferroelectric material of the three-dimensional memory device of FIG. 10C, in an embodiment.

FIG. 10D illustrates switching of the electrical polarization direction of the ferroelectric material 213 of the three-dimensional memory device 200. Three layers of different materials (e.g., 215, 213, and 203) within the dashed box 218 of FIG. 10C are illustrated on the left side of FIG. 10D. FIG. 10D shows that when the direction of an electrical field (E-field) applied to the ferroelectric material 213 is switched, the electric polarization direction of the ferroelectric material 213 switches accordingly. For example, an electrical field may be applied to the ferroelectric material 213 in FIG. 10D by applying a voltage between the gate electrode 212 and a respective source/drain layer 205 that is electrically coupled to (e.g., over and contacting) the channel layer 203 in FIG. 10C.

Figure 10E:
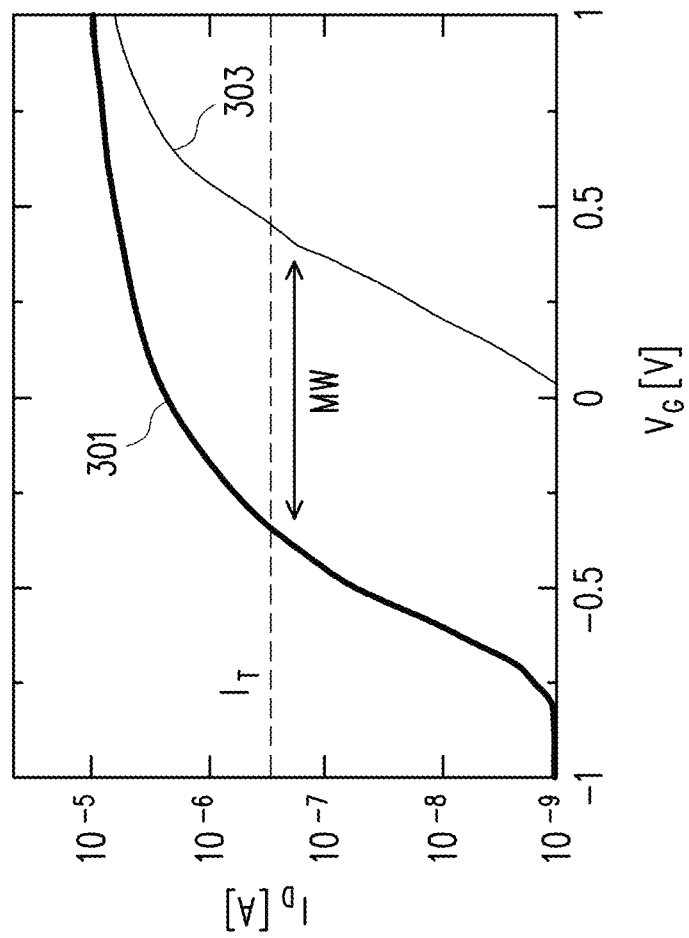
FIG. 10E illustrates the electrical characteristics of a memory device with ferroelectric material, in an embodiment.

FIG. 10E illustrates the electrical characteristics of a memory device (e.g., 200, 200A, 200B, 200C) with ferroelectric material, in an embodiment. The memory cell of the memory devices (e.g., 200, 200A, 200B, 200C) discussed herein comprises a transistor having the ferroelectric material 213 between the gate electrode 212 and the channel layer 203. The electrical polarization direction of the ferroelectric material 213 affects the threshold voltage of the transistor of the memory cell. FIG. 10E shows two voltage vs. current curves 301 and 303 of an example memory cell. The curves 301 and 303 correspond to two different electrical polarization directions of the ferroelectric material 213. The dashed horizontal line in FIG. 10E shows the current value that corresponds to the ON state of the transistor. As illustrated in FIG. 10E, the two different electrical polarization directions of the ferroelectric material 213 result in two different threshold voltages of the transistor of the memory cell.

Figure 10G:
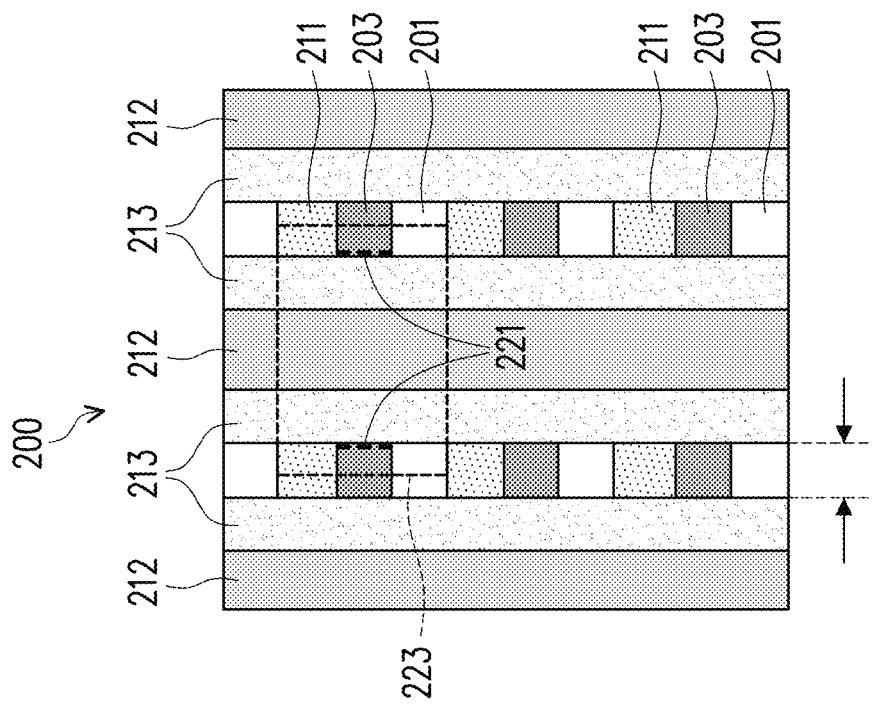
Figure 10F:
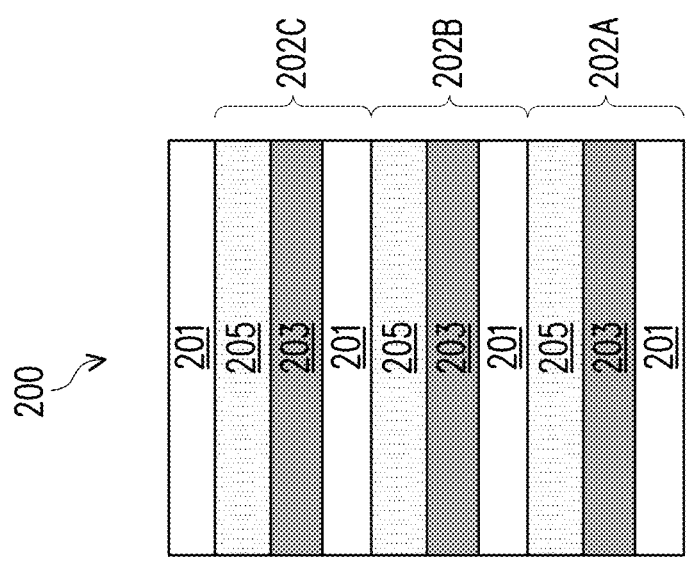

FIGS. 10F and 10G illustrate cross-sectional views of the 3D memory device 200 along cross-sections E-E and F-F in FIG. 10B, respectively. FIG. 10F shows the layer stacks 202A, 202B, and 202C, as well as the topmost dielectric layer 201. FIG. 10G shows the cross-sectional view of a portion of the 3D memory device 200 along cross-section F-F, which includes three adjacent gate electrodes 212 and layers between those gate electrodes 212.

Note that in FIG. 10G, the source/drain layer 205 in each of the layer stacks 202 is replaced by the inner spacers 211. As illustrated in FIG. 10G (see also FIG. 10I), the inner spacers 211 fill the space between the ferroelectric material 213 disposed along sidewalls of adjacent gate electrodes 212, and has the width W1. In other words, no source/drain layer 205 is visible in the cross-sectional view of FIG. 10G. Recall that the width W2 (see FIGS. 4 and 10I) of the recess 209 is larger than or equal to half of the distance W1 between adjacent openings 207. As a result, the inner spacers 211 fill the recesses 209 and completely fill the spaces between adjacent openings 207. Note that the sidewalls of the ferroelectric material 213 facing the inner spacers 211 in FIG. 10G are at the same locations as the sidewalls of the openings 207.

The dashed lines 221 in FIG. 10G (also illustrated in FIG. 10C) illustrates the channel regions formed during operation of the 3D memory device 200. The electrical current flows in and out of the paper along the channel regions in the cross-sectional view of FIG. 10G. FIG. 10G further illustrate a plurality of memory cells 223, where each memory cell 223 includes portions of the various layers/materials within the area of the memory cells 223. For example, each memory cell 223 includes (portions of) the gate electrode 212, the ferroelectric material 213, the inner spacer 211, the dielectric layer 201, the channel layer 203, and source/drain regions 205A/205B (see FIG. 10I). Therefore, each memory cell 223 is a transistor with the ferroelectric material 213 between the gate electrode 212 and the channel layer 203. Note that to avoid clutter, FIG. 10G only shows dashed boxes around one memory cell 223 of the 3D memory device 200, and dashed boxes are not shown around other memory cells of the 3D memory device 200.

FIG. 10H illustrates a cross-sectional view of the 3D memory device 200 of FIG. 10A along cross-sectional D-D. The cross-section D-D is along a horizontal plane that cuts across the channel layer 203. As illustrated in FIG. 10H, the ferroelectric material 213 extends along sidewalls of the gate electrode 212, and is disposed between the gate electrodes 212 and the channel layer 203. Sidewalls 213S1/213S2 of the ferroelectric material 213 are aligned with respective sidewalls of the dielectric material 219, such that a width of the ferroelectric material 213 in FIG. 10H, measured along the horizontal direction of FIG. 10H, is the same as the width W3 of the dielectric material 219 measured along the same horizontal direction. In addition, FIG. 10H shows dashed boxes around one of the memory cells 223, and the dashed lines 221 shows the channel regions in the memory cell 223.

FIG. 10I illustrates a cross-sectional view of the 3D memory device 200 of FIG. 10A along cross-sectional C-C. The cross-section C-C is along a horizontal plane that cuts across the source/drain layer 205. As illustrated in FIG. 10I, the inner spacer layer 211, which is a continuous region in the cross-sectional view of FIG. 10I, completely fills the spaces between portions of the ferroelectric material 213 extending along adjacent gate electrodes 212, and also fills the space between the lowermost portion 213L of the ferroelectric material 213 and the dielectric material 219. As a result, the inner spacer layer 211 and the dielectric material 219 separates the source/drain layer 205 into two separate (e.g., spaced apart) source/drain regions 205A and 205B.

Figure 10J:
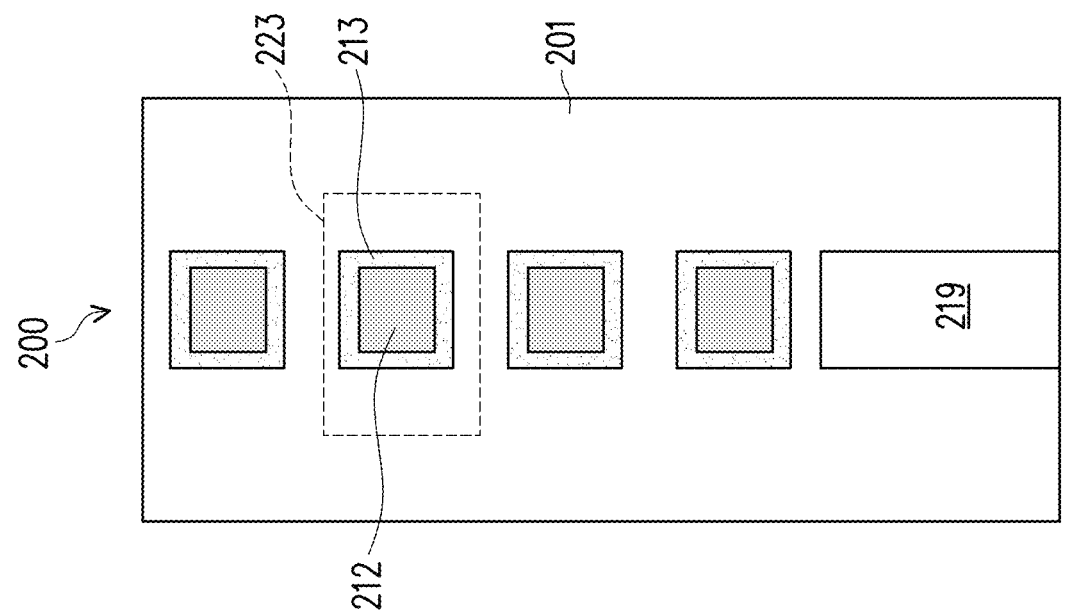

FIG. 10J illustrates a top view of the 3D memory device 200 of FIG. 10A. A dashed box is illustrated around one of the memory cells 223.

Figure 11:
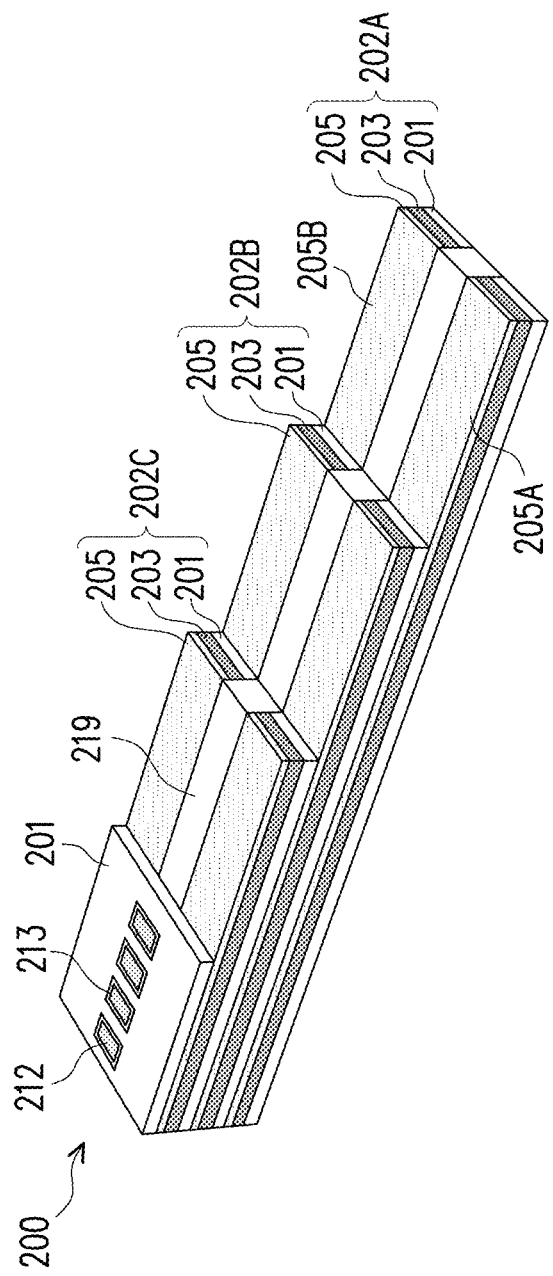

Next, in FIG. 11, a staircase-shaped contact region is formed in the 3D memory device 200, so that a portion of the source/drain layer 205 of each of the layer stacks 202 is exposed. The staircase-shaped contact region may be formed by a plurality of etching processes, where each of the etching processes is performed by using a different etching mask to expose a different portion of the 3D memory device 200 for removal, and by etching for a different duration to achieve different etching depth, as an example. The unetched portion of the 3D memory device 200, which includes the gate electrodes 212 and the ferroelectric material 213 around the gate electrodes 212, form the memory cell array of the 3D memory device 200.

As illustrated in FIG. 11, a portion of each of the layer stacks 202 laterally distal from the memory cell array is removed to form the staircase-shaped contact region. The areas (e.g., surface area in a top view) of the removed portion of the layer stack 202 increase along a vertical direction away from the substrate 101 (see FIG. 1). In other words, the higher (further away from the substrate 101) is the layer stack 202 (e.g., 202A, 202B, or 202C), the more areas of the layer stack are removed, such that a layer stack exposes a portion of an underlying layer stack. Note that the source/drain layer 205 in each of the layer stacks 202 is separated into two separate source/drain regions 205A and 205B that are disposed on opposing sides of the dielectric material 219.

Figure 12:
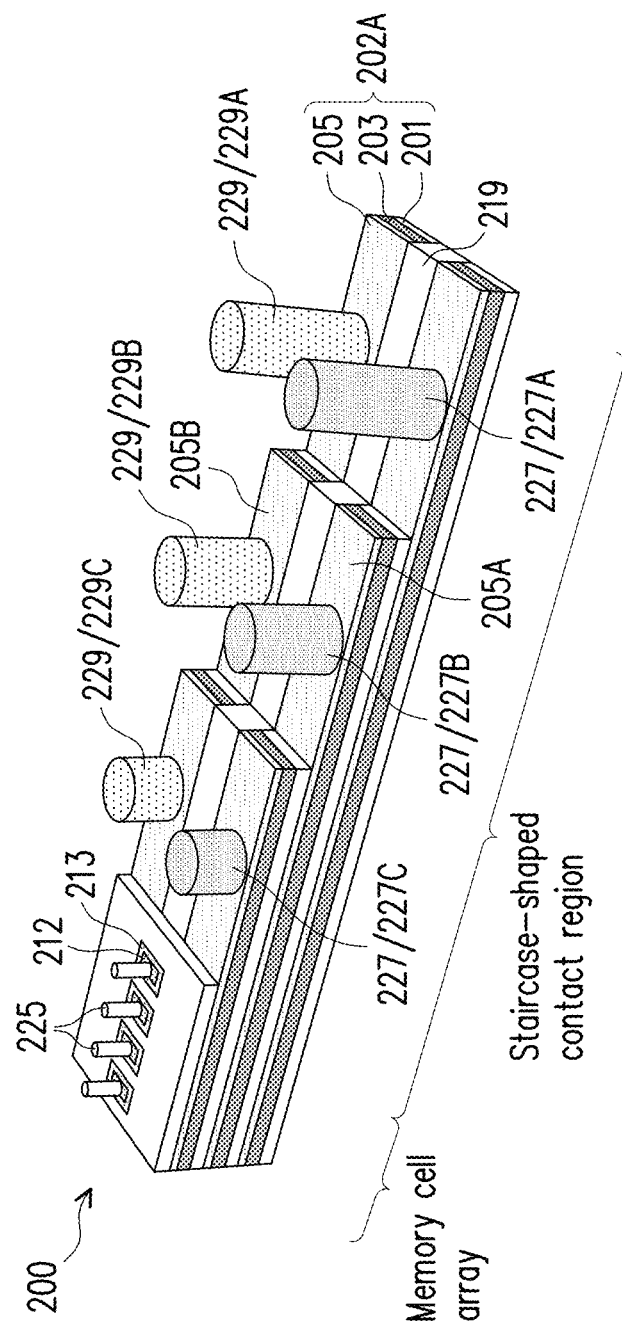

Next, in FIG. 12, gate contacts 225 are formed over and electrically coupled to the gate electrodes 212, source/drain contacts 227 (e.g., 227A, 227B, and 227C) are formed over and electrically coupled to the source/drain regions 205A, and source/drain contacts 229 (e.g., 229A, 229B, and 229C) are formed over and electrically coupled to the source/drain regions 205B. In the context of memory device, each of the gate contacts 225 may also be referred to as a word line (WL), each of the source/drain contacts 227 may also be referred to as a source line (SL), and each of the source/drain contacts 229 may also be referred to as a bit line (BL). The gate contacts 225 and the source/drain contacts 227/229 may be formed by forming a dielectric layer (not shown) over the structure of FIG. 11, forming openings in the dielectric layer at locations corresponding to the gate contacts 225 and the source/drain contacts 227/229, where the openings expose the underlying conductive feature (e.g., gate electrodes 212, or the source/drain regions 205A/205B), and filling the openings with an electrically conductive material, such as Cu, W, Au, Ag, Co, Ti, Ta, TaN, TiN, combinations thereof, multilayers thereof, or the like.

As illustrated in FIG. 12, due to different upper surfaces of the source/drain layers 205 of the layer stacks 202 being at different vertical levels (e.g., distances from the substrate 101), lower surfaces of the source/drain contacts 227 (or 229) on different layer stacks 202 are also at different vertical levels. For example, the lower surfaces of the source/drain contacts 227 (or 229) on the layer stack 202A are closer to the substrate 101 than the lower surfaces of the source/drain contacts 227 (or 229) on the layer stacks 202B/202C.

In the example of FIG. 12, four gate contacts 225 are shown. Each of the gate contacts 225 and the source/drain contacts 227/229 coupled to the source/drain regions 205A/205B at a same vertical level define the three terminals of a memory cell (e.g., a transistor with ferroelectric material 213). Therefore, in the example of FIG. 12, the four gate contacts 225 and the three pairs of source/drain contacts 227/229 define a total of 12 memory cells.

Referring to FIGS. 12 and FIGS. 10G-10J, to perform a write operation on a particular memory cell, e.g., the memory cell 223 in FIG. 10G, a write voltage is applied across a portion of the ferroelectric material 213 within the memory cell 223. The write voltage may be applied, for example, by applying a first voltage to the gate electrode 212 of the memory cell 223 (through the gate contact 225), and applying a second voltage to the source/drain regions 205A/205B (through source/drain contacts 227/229). The voltage difference between the first voltage and the second voltage sets the polarization direction of the ferroelectric material 213. Depending on the polarization direction of the ferroelectric material 213, the threshold voltage VT of the corresponding transistor of the memory cell 223 can be switched from a low threshold voltage VL to a high threshold voltage VH, or vice versa. The threshold voltage value (VL or VH) of the transistor can be used to indicate a bit of "0" or a "1" stored in the memory cell.

To perform a read operation on the memory cell 223, a read voltage, which is a voltage between the low threshold voltage VL and the high threshold voltage VH, is applied to the transistor, e.g., between the gate electrode 212 and the source/drain region 205A. Depending on the polarization direction of the ferroelectric material 213 (or the threshold voltage of the transistor), the transistor of the memory cells 223 may or may not be turned on. As a result, when a voltage is applied, e.g., at the source/drain region 205B, an electrical current may or may not flow between the source/drain regions 205A and 205B. The electrical current may thus be detected to determine the digital bit stored in the memory cell.

Figure 13:
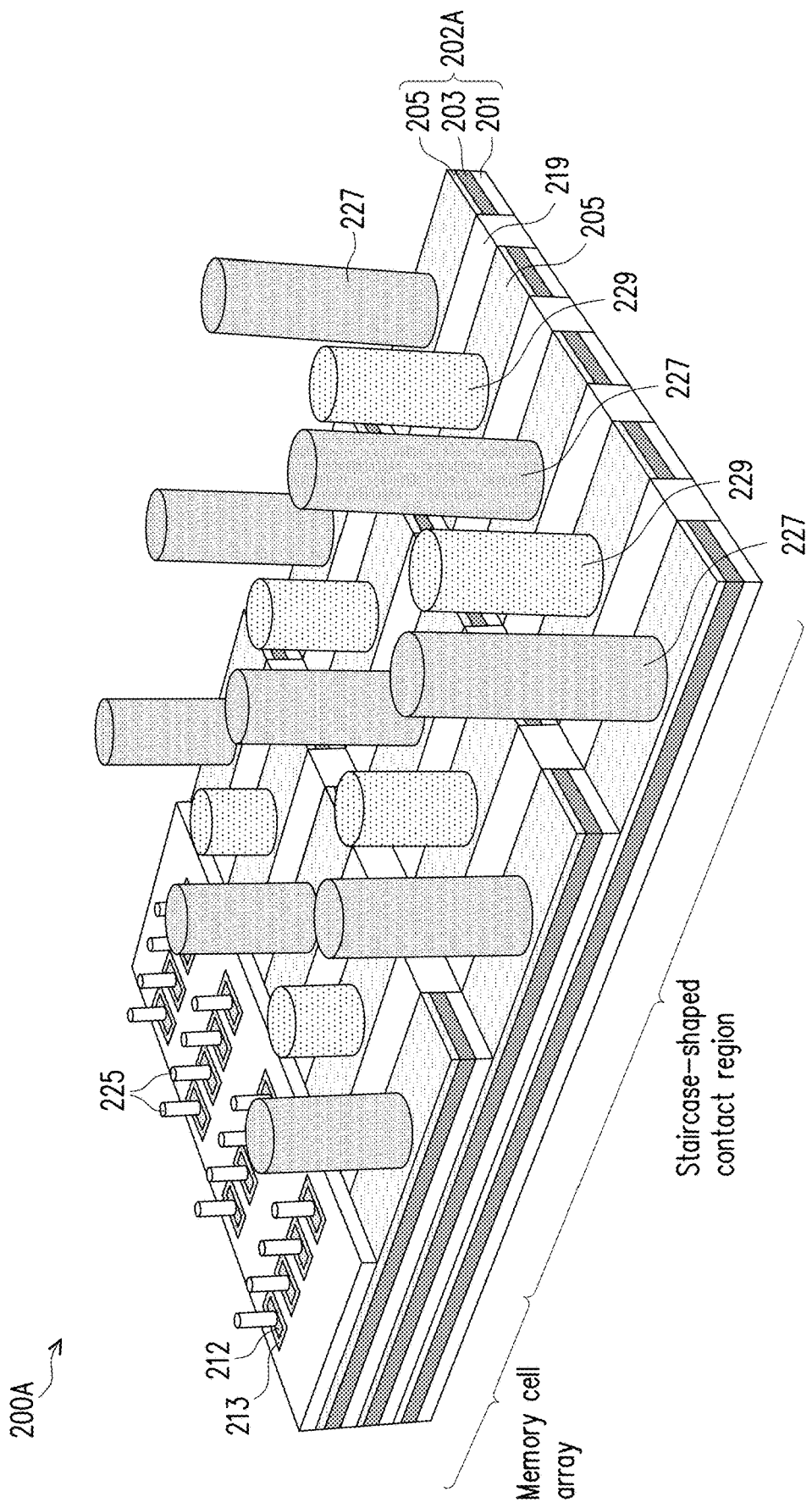
FIG. 13 illustrates a perspective view of a three-dimensional memory device, in another embodiment.

FIG. 13 illustrates a perspective view of a three-dimensional (3D) memory device 200A, in another embodiment. The 3D memory device 200A is similar to the 3D memory device 200 of FIG. 12, but with multiple rows and multiple columns of gate electrodes 212, and multiple isolation regions 219 which separate each source/drain layer 205 into multiple separate source/drain regions. The 3D memory device 200A may be formed by modifying the fabrication process of 3D memory device 200, e.g., by forming multiple rows and multiple columns of openings 207 in the processing step of FIG. 4, then following similar processing steps through FIGS. 8A/8B to form multiple gate electrodes 212, then form multiple recesses 217 in the processing step of FIG. 9 and filling the multiple recesses 217 with dielectric material 219. Subsequent processing steps, such as forming the staircase-shaped contact region, forming the gate contacts 225, and forming the source/drain contacts 227/229, are straightforward, thus details are not repeated.

Figure 14:
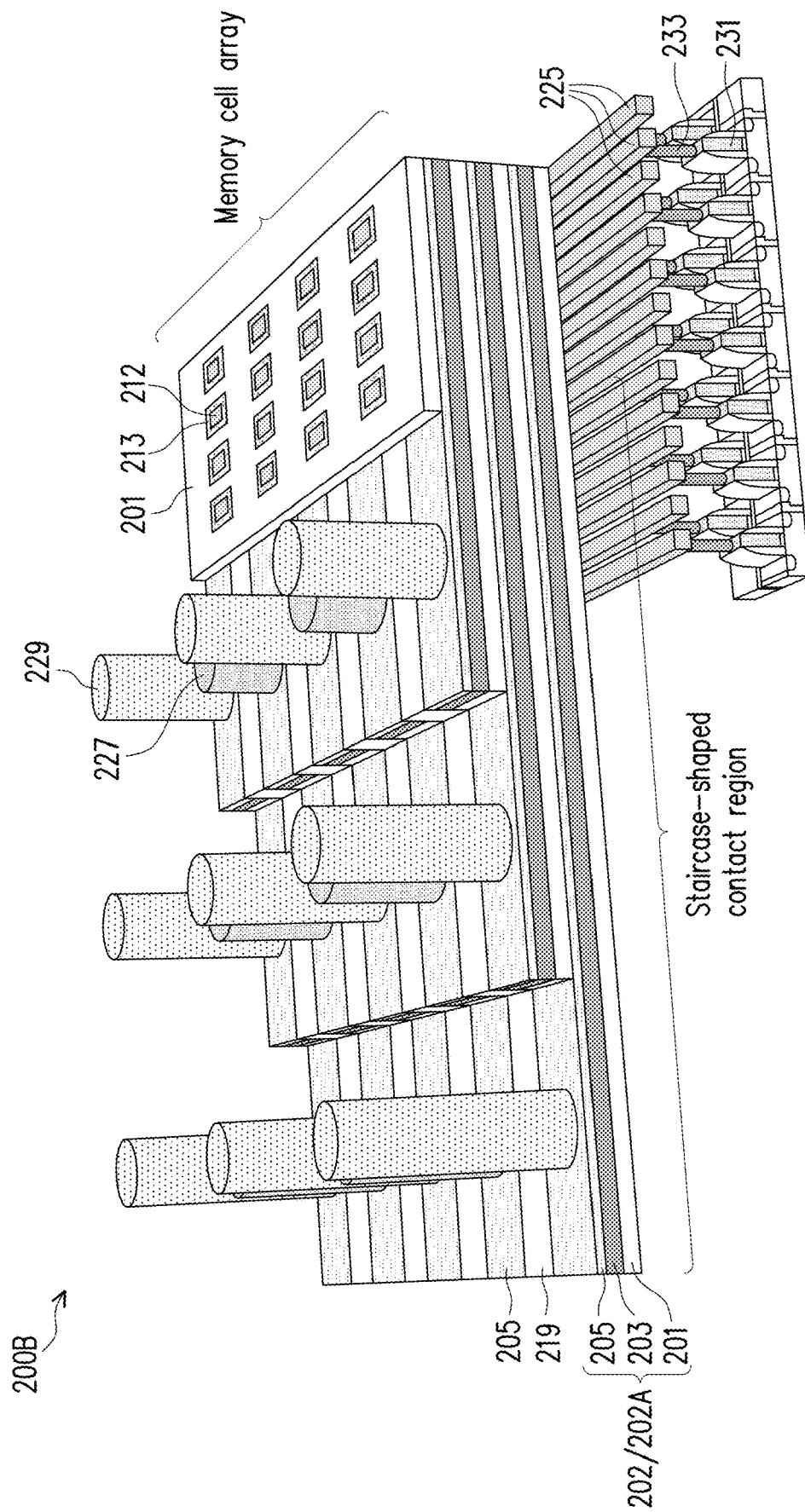
FIG. 14 illustrates a perspective view of a three-dimensional memory device, in another embodiment.

FIG. 14 illustrates a perspective view of a three-dimensional (3D) memory device 200B, in another embodiment. The 3D memory device 200B is similar to the 3D memory device 200A of FIG. 13, but with the gate contacts 225 formed under the layer stack 202A. Since the gate electrodes 212 extend through the layer stacks 202, lower surfaces of the gate electrodes are exposed at the lower surface of the layer stack 202. Therefore, forming gate contacts 225 under the gate electrodes 212 may be easily achieved. For example, before forming the layer stack 202A in FIG. 2, a metal layer may be formed over the dielectric layer 119 in FIG. 1 to form metal features (e.g., 225) at locations over which the gate electrodes 212 are formed in subsequent processing. In subsequent processing, once formed, the gate electrodes 212 will be electrically coupled to the gate contacts 225 in the metal layer.

FIG. 14 further illustrates transistors 231 and vias 233 that electrically couple the gate contacts 225 to the transistors 231. The transistors 231 and vias 233 are part of the semiconductor device 100 of FIG. 1 and not part of the 3D memory device 200B, in the illustrated embodiment. The transistors 231 may be the FinFETs formed over the substrate 101 of FIG. 1, and the vias 233 may be formed under the 3D memory device 200A to electrically couple to the FinFETs.

Figure 15:
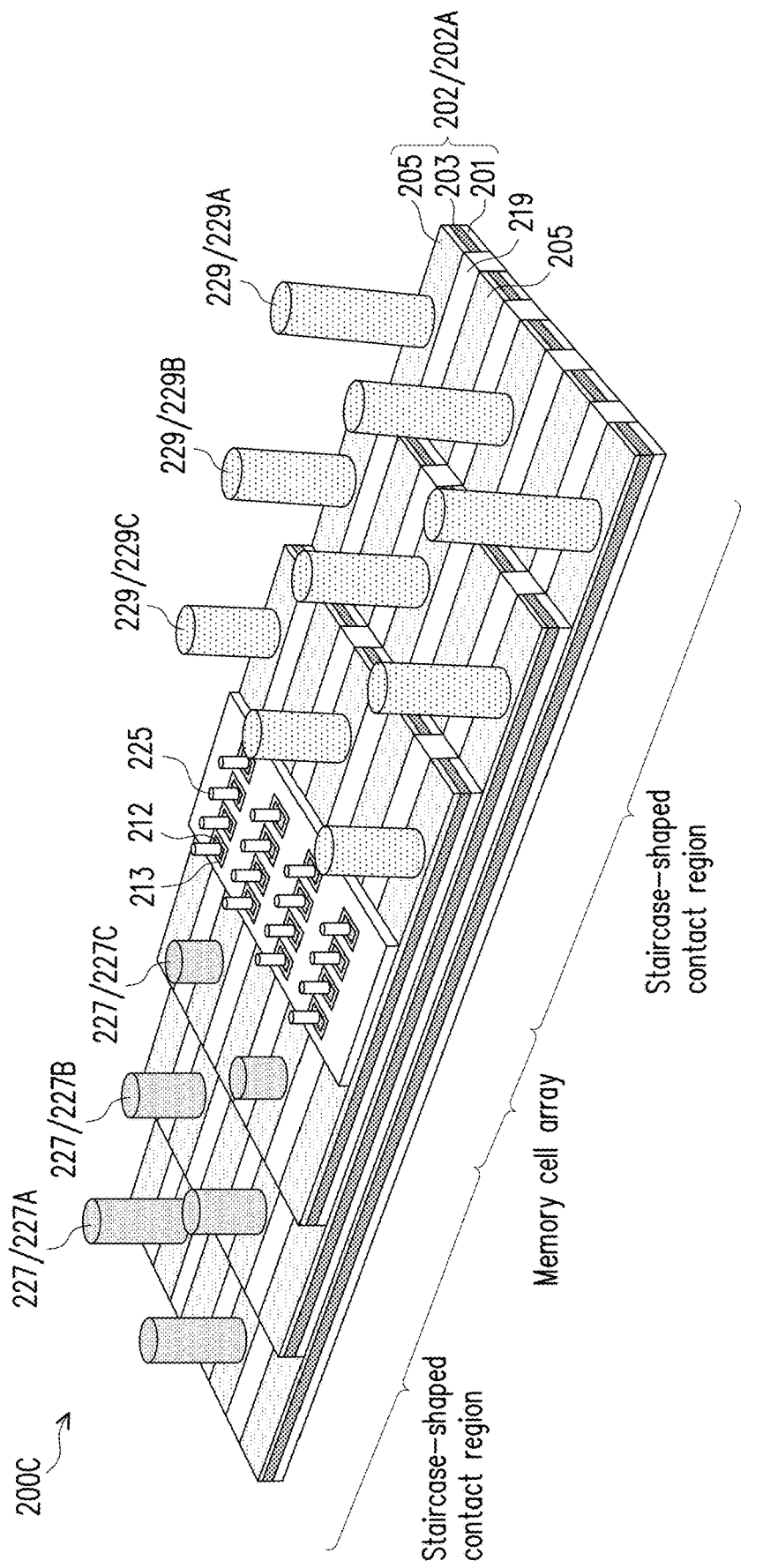
FIG. 15 illustrates a perspective view of a three-dimensional memory device, in yet another embodiment.

FIG. 15 illustrates a perspective view of a three-dimensional (3D) memory device 200C, in yet another embodiment. The 3D memory device 200C is similar to the 3D memory device 200A of FIG. 13, but with the memory cell array formed in a middle portion of the 3D memory device 200C, with two staircase-shaped contact regions formed on opposing sides of the memory cell array. The 3D memory device 200C may be formed by modifying the fabrication process for the 3D memory device 200A. For example, in the process step of FIG. 3, the openings 207 are formed in a center region of the layer stacks 202. In subsequent processing, such as in FIG. 9, recesses 217 are formed on opposing sides of the gate electrodes 212. The rest of the processing steps are similar to those for the 3D memory device 200A, thus details are not repeated.

Figure 16:
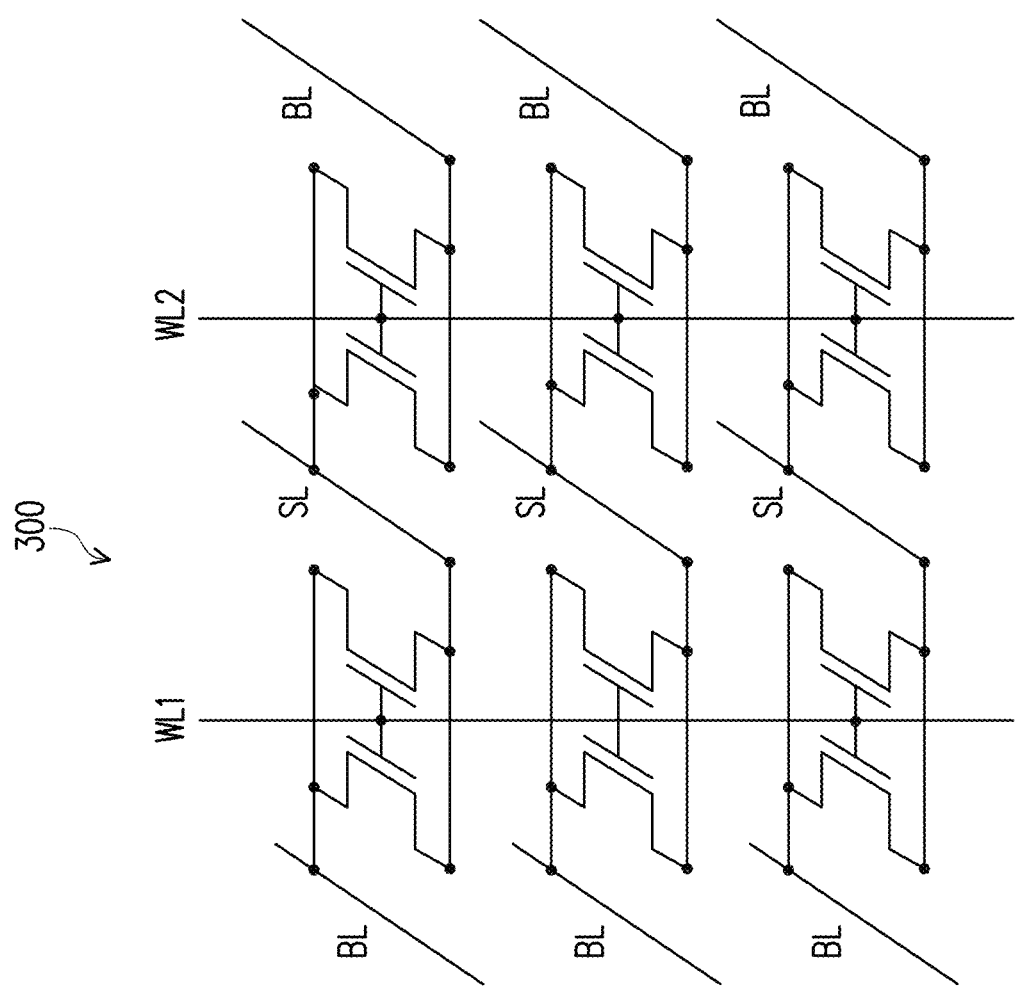
FIG. 16 illustrates an equivalent circuit diagram of a three-dimensional memory device, in an embodiment.

FIG. 16 illustrates an equivalent circuit diagram 300 of a three-dimensional memory device, in an embodiment. The circuit diagram 300 corresponds to a portion of the 3D memory device 200, 200A, 200B, or 200C, in an embodiment. Memory cells in the circuit diagram 300 are illustrated as transistors with terminals labeled as SL, BL, and WL (e.g., WL1, WL2), where terminals SL, BL, and WL correspond to the gate contacts 225, the source/drain contacts 227, and the source/drain contacts 229, respectively. Three layers of memory cells are illustrated in FIG. 16, which corresponds to the memory cells formed in the three layer stacks 202 in FIGS. 12-15. The WLs extend vertically to electrically connect the memory cells implemented in different layer stacks 202.

Figure 17:
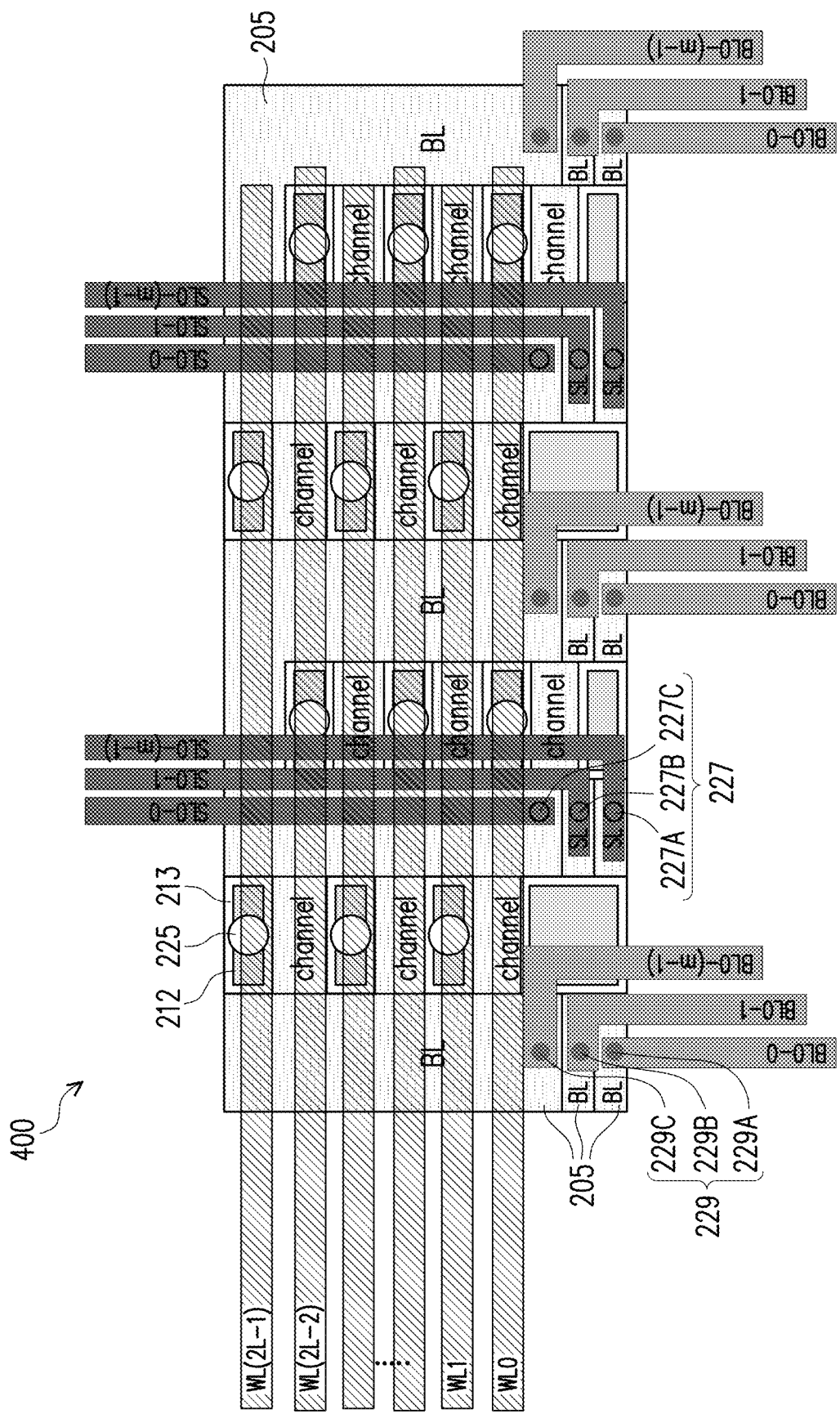
FIG. 17 illustrates a layout for a three-dimensional memory device, in an embodiment.

FIG. 17 illustrates a layout 400 for a three-dimensional memory device (e.g., 200, 200A, 200B, or 200C), in an embodiment. The layout 400 corresponds to a plan view of the 3D memory device, with features at different vertical levels projected on a same plane. In FIG. 17, the boundaries of three of the source/drain layers 205 are shown. The bottom portions of the source/drain layers 205 correspond to the stair-cased shaped contact region. FIG. 17 also illustrates gate electrodes 212, the ferroelectric material 213, gate contacts 225, and source/drain contacts 227/229. Furthermore, FIG. 17 illustrates conductive lines (e.g., copper lines) electrically coupled to the gate contacts 225 and the source/drain contacts 227/229. For example, conductive lines coupled to the gate contacts 225 are labeled with WL, such as WL0, WL1, . . . , WL(2L−1). Conductive lines coupled to the source/drain contacts 227 are labeled as SL, such as SL0-0, SL0-1, . . . , SL0-($m$−1), and so on. Conductive lines coupled to the source/drain contacts 229 are labeled as BL, such as BL0-0, BL0-1, . . . , BL0-($m$−1), and so on. Note that the stair-cased shaped contact region provides easy access to the source/drain layers 205.

Variations and modifications to the disclosed embodiments are possible and are fully intended to be included within the scope of the present disclosure. For example, three layer stacks 202 (e.g., 202A, 202B, and 202C) are illustrated in the 3D memory devices 200, 200A, 200B, and 200C as non-limiting examples. The number of layer stacks 202 in the 3D memory device can be any suitable number, such as one, two, or more than three, as skilled artisans readily appreciate. As another example, the number of rows and columns of gate electrodes 212, and/or the number of isolation regions 219, may be any suitable number. In addition, while the top view of the openings 207 are illustrated as rectangles or squares, other shapes for the openings 207 (thus other shapes for the gate electrodes 212), such as circle, oval, or polygon, may also be used.

Embodiments may achieve advantages. The disclosed 3D memory devices can be easily integrated into existing semiconductor devices during the BEOL processing. The areas under the 3D memory devices can still be used to form various circuits, such as logic circuits, I/O circuits, or ESD circuits during the FEOL processing. Therefore, besides the peripheral circuits (e.g., decoders, amplifiers) and routing circuits used for the 3D memory devices, there is little penalty in terms of foot print for integrating the disclosed 3D memory devices. In addition, the disclosed 3D memory devices have highly efficient structures to reduce its memory cell size. For example, the BL and SL coupled to the source/drain layer 205 of a layer stack are shared by multiple memory cells formed within the same layer stack. The WL is connected to the gate electrode 212 which extends through all the layer stacks 202, and therefore, the WL is also shared by vertically aligned memory cells formed in different layer stacks 202. As discussed above, the disclosed 3D memory devices have structures that can be scaled easily to allow for high-density memory arrays to be formed, which is important for emerging applications such as Internet of Things (IoT) and machine learning. By integrating the 3D memory arrays on chip during the BEOL processing, issues such as energy consumption bottleneck due to off-chip memory access are avoided. As a result, semiconductor devices with the disclosed 3D memory devices integrated may be made smaller, cheaper, while operating at faster speed and consuming less power. Additional advantage may include reduced parasitic capacitance by the formation of the inner spacers.

Figure 18:
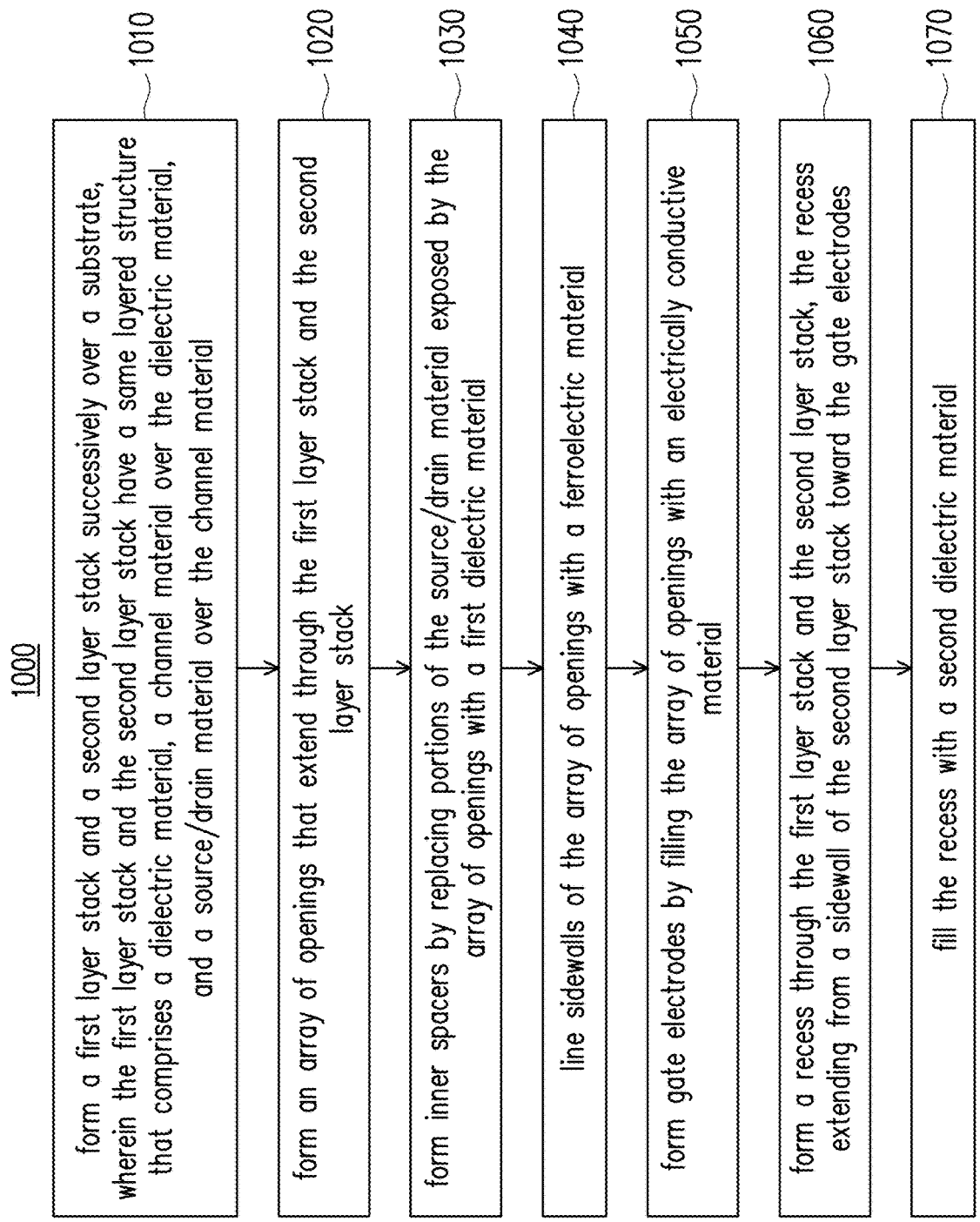
FIG. 18 illustrates a flow chart of a method of forming a memory device, in some embodiments.

FIG. 18 illustrates a flow chart of a method of forming a memory device, in some embodiments. It should be understood that the embodiment method shown in FIG. 18 is merely an example of many possible embodiment methods. One of ordinary skill in the art would recognize many variations, alternatives, and modifications. For example, various steps as illustrated in FIG. 18 may be added, removed, replaced, rearranged, or repeated.

Referring to FIG. 18, at block 1010, a first layer stack and a second layer stack are formed successively over a substrate, wherein the first layer stack and the second layer stack have a same layered structure that comprises a dielectric material, a channel material over the dielectric material, and a source/drain material over the channel material. At block 1020, an array of openings are formed that extend through the first layer stack and the second layer stack. At block 1030, inner spacers are formed by replacing portions of the source/drain material exposed by the array of openings with a first dielectric material. At block 1040, sidewalls of the array of openings are lined with a ferroelectric material. At block 1050, gate electrodes are formed by filling the array of openings with an electrically conductive material. At block 1060, a recess is formed through the first layer stack and the second layer stack, the recess extending from a sidewall of the second layer stack toward the gate electrodes. At block 1070, the recess is filled with a second dielectric material.

In accordance with an embodiment, a method of forming a memory device includes: forming a first layer stack over a substrate, the first layer stack comprising a first dielectric layer, a first channel layer, and a first source/drain layer formed successively over the substrate; forming a second layer stack over the first layer stack, the second layer stack comprising a second dielectric layer, a second channel layer, and a second source/drain layer formed successively over the first layer stack; forming openings extending through the first layer stack and the second layer stack; forming inner spacers in the first source/drain layer and in the second source/drain layer by replacing a first portion of the first source/drain layer and a second portion of the second source/drain layer exposed by the openings with a first dielectric material; after forming the inner spacers, lining sidewalls of the openings with a ferroelectric material; after lining the sidewalls of the openings, filling the openings with an electrically conductive material to form gate electrodes; forming a recess that extends through the first layer stack and the second layer stack, the recess extending from a sidewall of the first layer stack toward the gate electrodes; and filling the recess with a second dielectric material. In an embodiment, the method further includes after filling the recess, forming a first stair-case shaped region in the memory device by removing a portion of the second layer stack laterally distal from the gate electrodes to expose a first portion of the first source/drain layer of the first layer stack. In an embodiment, the method further includes, after forming the first stair-case shaped region: forming first source/drain contacts on the first portion of the first source/drain layer; forming second source/drain contacts on a first portion of the second source/drain layer, wherein the first portion of the first source/drain layer and the first portion of the second source/drain layer are disposed on a same side of the gate electrodes; and forming gate contacts electrically coupled to the gate electrodes. In an embodiment, the method further includes forming a third dielectric layer over the second layer stack before forming the openings, wherein the openings are formed to extend through the third dielectric layer. In an embodiment, the method further includes before forming the second source/drain contacts, removing a portion of the third dielectric layer laterally distal from the gate electrodes to expose the first portion of the second source/drain layer. In an embodiment, the gate contacts are formed over upper surfaces of the gate electrodes distal from the substrate. In an embodiment, the gate contacts are formed under the first layer stack such that the gate contacts are between the first layer stack and the substrate. In an embodiment, the method further includes: forming a second staircase shaped region in the memory device by removing another portion of the second layer stack to expose a second portion of the first source/drain layer, wherein the gate electrodes are laterally between the first portion of the first source/drain layer and the second portion of the first source/drain layer; forming third source/drain contacts on the second portion of the first source/drain layer; and forming fourth source/drain contacts on a second portion of the second source/drain layer, wherein the gate electrodes are laterally between the first portion of the second source/drain layer and the second portion of the second source/drain layer. In an embodiment, replacing the first portion of the first source/drain layer and the second portion of the second source/drain layer includes: performing an etching process to remove the first portion of the first source/drain layer and the second portion of the second source/drain layer that are exposed by the openings; after performing the etching process, depositing the first dielectric material in the openings, wherein the first dielectric material lines sidewalls and bottoms of the openings, and fills spaces left by the removed first portion of the first source/drain layer and by the removed second portion of the second source/drain layer; and performing an anisotropic etching process to remove the first dielectric material from the sidewalls and the bottoms of the openings. In an embodiment, a first width of the removed first portion of the first source/drain layer and a second width of the removed second portion of the second source/drain layer are equal to or larger than half of a distance between adjacent ones of the openings. In an embodiment, sidewalls of the recess form a U-shape in a top view. In an embodiment, the first dielectric layer and the second dielectric layer are formed of a same dielectric material, the first source/drain layer and the second source/drain layer are formed of a first material, and the first channel layer and the second channel layer are formed of a second material. In an embodiment, the first material is a metal-containing material, and the second material is a semiconductive oxide material.

In accordance with an embodiment, a method of forming a memory device includes: forming a first layer stack and a second layer stack successively over a substrate, wherein the first layer stack and the second layer stack have a same layered structure that comprises a dielectric material, a channel material over the dielectric material, and a source/drain material over the channel material; forming an array of openings that extend through the first layer stack and the second layer stack; forming inner spacers by replacing portions of the source/drain material exposed by the array of openings with a first dielectric material; lining sidewalls of the array of openings with a ferroelectric material; forming gate electrodes by filling the array of openings with an electrically conductive material; forming a recess through the first layer stack and the second layer stack, the recess extending from a sidewall of the second layer stack toward the gate electrodes; and filling the recess with a second dielectric material. In an embodiment, after filling the recess, the second dielectric material and the first dielectric material separate the source/drain material in each of the first and the second layer stacks into a plurality of separate source/drain regions. In an embodiment, the method further includes: forming gate contacts electrically coupled to the gate electrodes; removing portions of the second layer stack to expose portions of the source/drain material of the first layer stack; and forming source/drain contacts electrically coupled to the exposed portions of the source/drain material of the first layer stack. In an embodiment, the channel material is an oxide semiconductor material, and the source/drain material is a metal-containing material.

In accordance with an embodiment, a memory device includes: a first layer stack comprising a first dielectric layer, a first channel layer over the first dielectric layer, and a first source/drain layer over the first channel layer; a second layer stack over the first layer stack, the second layer stack comprising a second dielectric layer, a second channel layer over the second dielectric layer, and a second source/drain layer over the second channel layer, wherein the first layer stack extends beyond lateral extents of the second layer stack, and the second layer stack exposes portions of the first source/drain layer; a gate electrode extending through the first layer stack and the second layer stack; a ferroelectric material around and contacting the gate electrode; and an isolation region extending through the first layer stack and second layer stack, wherein the gate electrode is spaced apart from the isolation region and is disposed along a longitudinal axis of the isolation region. In an embodiment, the memory device further includes: a word line (WL) electrically coupled to the gate electrode; a first bit line (BL) and a second BL electrically coupled to a first portion of the first source/drain layer and a first portion of the second source/drain layer, respectively; and a first source line (SL) and a second SL electrically coupled to a second portion of the first source/drain layer and a second portion of the second source/drain layer, respectively, wherein the first portion of the first source/drain layer and the first portion of the second source/drain layer are disposed on a first side of the isolation region, wherein the second portion of the first source/drain layer and the second portion of the second source/drain layer are disposed on a second opposing side of the isolation region. In an embodiment, the word line extends below the first layer stack, wherein the first BL, the second BL, the first SL, and the second SL extend above the second layer stack.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory device comprising:
a first layer stack comprising a first dielectric layer, a first channel layer over the first dielectric layer, and a first source/drain layer over the first channel layer;
a second layer stack over the first layer stack, the second layer stack comprising a second dielectric layer, a second channel layer over the second dielectric layer, and a second source/drain layer over the second channel layer, wherein the first layer stack extends beyond lateral extents of the second layer stack, and the second layer stack exposes portions of the first source/drain layer;
a gate electrode extending through the first layer stack and the second layer stack;
a ferroelectric material around and contacting the gate electrode; and
an isolation region extending through the first layer stack and second layer stack, wherein the isolation region extends from a sidewall of the first layer stack toward the gate electrode, wherein the gate electrode is spaced apart from the isolation region.

2. The memory device of claim 1, further comprising:
a first inner spacer embedded in the first source/drain layer; and
a second inner spacer embedded in the second source/drain layer, wherein the first inner spacer and the second inner spacer surround the gate electrode and the ferroelectric material.

3. The memory device of claim 2, wherein the first inner spacer and the second inner spacer comprise a same dielectric material, wherein the first inner spacer has a same thickness as the first source/drain layer, and the second inner spacer has a same thickness as the second source/drain layer.

4. The memory device of claim 2, wherein the first inner spacer and the isolation region separate the first source/drain layer into a first source/drain region and a second source/drain region spaced apart from the first source/drain region, wherein the second inner spacer and the isolation region separate the second source/drain layer into a third source/drain region and a fourth source/drain region spaced apart from the third source/drain region.

5. The memory device of claim 4, further comprising:
a gate contact electrically coupled to the gate electrode;
a first source/drain contact and a second source/drain contact electrically coupled to the first source/drain region and the second source/drain region, respectively; and
a third source/drain contact and a fourth source/drain contact electrically coupled to the third source/drain region and the fourth source/drain region, respectively.

6. The memory device of claim 5, wherein the gate contact is connected to an upper surface of the gate electrode distal from the first layer stack.

7. The memory device of claim 5, wherein the gate contact is connected to a lower surface of the gate electrode distal from the second layer stack.

8. The memory device of claim 2, wherein the ferroelectric material contacts and extends along sidewalls of the gate electrode, wherein the ferroelectric material extends through the first layer stack and the second layer stack.

9. The memory device of claim 8, wherein the first inner spacer and the second inner spacer contact the ferroelectric material.

10. The memory device of claim 2, further comprising a third dielectric layer over the second layer stack, wherein the second layer stack extends beyond lateral extents of the third dielectric layer, and the third dielectric layer exposes portions of the second source/drain layer.

11. The memory device of claim 2, wherein the first source/drain layer and the second source/drain layer comprise a same metal-containing material, wherein the first channel layer and the second channel layer comprise a same semiconductive oxide material.

12. A memory device comprising:
a first layer stack and a second layer stack that are disposed over a substrate, wherein the first layer stack is between the second layer stack and the substrate, wherein the first layer stack and the second layer stack have a same layered structure that comprises a dielectric material, a channel material over the dielectric material, and a source/drain material over the channel material, wherein a first portion of the first layer stack extends laterally beyond boundaries of the second layer stack;
a gate electrode extending through the first layer stack and the second layer stack;
a ferroelectric material extending along sidewalls of the gate electrode;

a first inner spacer around and contacting the ferroelectric material, wherein the first inner spacer is at a same distance from the substrate as the source/drain material of the first layer stack;

a second inner spacer around and contacting the ferroelectric material, wherein the second inner spacer is at a same distance from the substrate as the source/drain material of the second layer stack; and an isolation region extending through the first layer stack and the second layer stack, wherein the isolation region extends from a sidewall of the first layer stack toward the gate electrode, wherein the isolation region contacts the first inner spacer and the second inner spacer.

13. The memory device of claim 12, wherein the isolation region and the first inner spacer separate the source/drain material of the first layer stack into a first plurality of source/drain regions, wherein the isolation region and the second inner spacer separate the source/drain material of the second layer stack into a second plurality of source/drain regions.

14. The memory device of claim 12, wherein a second portion of the first layer stack extends laterally beyond the boundaries of the second layer stack, wherein the second layer stack is disposed laterally between the first portion and the second portion of the first layer stack.

15. The memory device of claim 12, further comprising:
a word line (WL) electrically coupled to the gate electrode;
a first bit line (BL) and a second BL electrically coupled to a first portion of the source/drain material of the first layer stack and a first portion of the source/drain material of the second layer stack, respectively; and
a first source line (SL) and a second SL electrically coupled to a second portion of the source/drain material of the first layer stack and a second portion of the source/drain material of the second layer stack, respectively, wherein the first portion of the source/drain material of the first layer stack and the first portion of the source/drain material of the second layer stack are disposed on a first side of the isolation region, wherein the second portion of the source/drain material of the first layer stack and the second portion of the source/drain material of the second layer stack are disposed on a second opposing side of the isolation region.

16. The memory device of claim 15, wherein the WL is between the first layer stack and the substrate.

17. The memory device of claim 15, wherein the second layer stack is between the WL and the first layer stack.

18. A memory device comprising:
a layer stack over a substrate, wherein the layer stack comprises a dielectric layer, a channel layer over the dielectric layer, and a source/drain layer over the channel layer;
a gate electrode extending through the layer stack;
a ferroelectric material extending along sidewalls of the gate electrode;
an inner spacer embedded in the source/drain layer, wherein the inner spacer surrounds and contacts the ferroelectric material; and
an isolation region extending through the layer stack, wherein the isolation region extends from a sidewall of the layer stack toward the gate electrode, wherein the isolation region and the inner spacer separate the source/drain layer into a first source/drain region and a second source/drain region.

19. The memory device of claim 18, wherein an upper surface of the inner spacer distal from the substrate and a lower surface of the inner spacer facing the substrate are level with an upper surface of the source/drain layer and a lower surface of the source/drain layer, respectively.

20. The memory device of claim 18, wherein the source/drain layer is a metal-containing material, and the channel layer is a semiconductive oxide material.

* * * * *